US012261120B2

(12) United States Patent
Lee

(10) Patent No.: US 12,261,120 B2
(45) Date of Patent: Mar. 25, 2025

(54) THREE-DIMENSIONAL (3D) SEMICONDUCTOR MEMORY DEVICE AND ELECTRONIC SYSTEM INCLUDING THE SAME

(71) Applicant: Samsung Electronics Co., Ltd., Suwon-si (KR)

(72) Inventor: Haemin Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 532 days.

(21) Appl. No.: 17/391,445

(22) Filed: Aug. 2, 2021

(65) Prior Publication Data

US 2022/0157726 A1 May 19, 2022

(30) Foreign Application Priority Data

Nov. 18, 2020 (KR) ........................ 10-2020-0154241

(51) Int. Cl.
*H01L 23/535* (2006.01)
*H10B 41/27* (2023.01)
*H10B 41/41* (2023.01)
*H10B 43/27* (2023.01)
*H10B 43/40* (2023.01)

(52) U.S. Cl.
CPC ........... *H01L 23/535* (2013.01); *H10B 41/27* (2023.02); *H10B 41/41* (2023.02); *H10B 43/27* (2023.02); *H10B 43/40* (2023.02)

(58) Field of Classification Search
CPC ....... H01L 23/535; H10B 41/27; H10B 41/41; H10B 43/27; H10B 43/40
See application file for complete search history.

(56) References Cited

U.S. PATENT DOCUMENTS

| | | | | |
|---|---|---|---|---|
| 9,230,987 | B2 | 1/2016 | Pachamuthu et al. | |
| 9,780,102 | B2 | 10/2017 | Simsek-Ege et al. | |
| 9,960,181 | B1 * | 5/2018 | Cui | H10B 41/50 |
| 10,381,371 | B2 | 8/2019 | Ogawa et al. | |
| 10,622,369 | B2 | 4/2020 | Zhou et al. | |

(Continued)

FOREIGN PATENT DOCUMENTS

KR 2016-0123081 A 10/2016

*Primary Examiner* — Yara B Green
*Assistant Examiner* — Fakeha Sehar
(74) *Attorney, Agent, or Firm* — HARNESS, DICKEY & PIERCE, P.L.C.

(57) ABSTRACT

A 3D semiconductor memory device includes a peripheral circuit structure, an intermediate insulating layer and a cell array structure. The cell array structure includes a first substrate including a cell array region and a connection region; a stack structure comprising electrode layers and electrode interlayer insulating layers alternately stacked on the first substrate; a planarization insulating layer covering an end portion of the stack structure on the connection region; and a first through-via penetrating the planarization insulating layer, the first substrate and the intermediate insulating layer. The first through-via connects one of the electrode layers to the peripheral circuit structure. The first through-via includes a first and second via portion integrally connected to each other. The first via portion penetrates the planarization insulating layer and has a first width. The second via portion penetrates the intermediate insulating layer and has a second width greater than the first width.

18 Claims, 31 Drawing Sheets

(56) References Cited

U.S. PATENT DOCUMENTS

| | | | | |
|---|---|---|---|---|
| 10,707,121 | B2 | 7/2020 | Liu et al. | |
| 2010/0320526 | A1* | 12/2010 | Kidoh | H10B 43/27<br>257/E21.409 |
| 2016/0086967 | A1* | 3/2016 | Lee | H10B 43/35<br>257/314 |
| 2016/0163732 | A1* | 6/2016 | Lim | H10B 43/27<br>257/314 |
| 2016/0307910 | A1 | 10/2016 | Son et al. | |
| 2017/0179153 | A1* | 6/2017 | Ogawa | H10B 41/41 |
| 2020/0227397 | A1* | 7/2020 | Yada | H10B 43/40 |

* cited by examiner

THREE-DIMENSIONAL (3D) SEMICONDUCTOR MEMORY DEVICE AND ELECTRONIC SYSTEM INCLUDING THE SAME

CROSS-REFERENCE TO RELATED APPLICATION

This U.S. non-provisional patent application claims priority under 35 U.S.C. § 119 to Korean Patent Application No. 10-2020-0154241, filed on Nov. 18, 2020, in the Korean Intellectual Property Office, the disclosure of which is hereby incorporated by reference in its entirety.

BACKGROUND

Embodiments of inventive concepts relate to a semiconductor device and/or an electronic system including the same, and more particularly, to a three-dimensional (3D) semiconductor memory device with improved reliability and integration density and/or an electronic system including the same.

Semiconductor devices have been highly integrated to provide excellent performance and low manufacturing costs. The integration density of semiconductor devices directly affects the costs of the semiconductor devices, thereby resulting in a demand of highly integrated semiconductor devices. The integration density of two-dimensional (2D) or planar semiconductor devices may be mainly determined by an area where a unit memory cell occupies. Therefore, the integration density of the 2D or planar semiconductor devices may be greatly affected by a technique of forming fine patterns. However, since extremely high-priced apparatuses are needed to form fine patterns, the integration density of 2D semiconductor devices continues to increase but is still limited. Thus, three-dimensional (3D) semiconductor memory devices have been developed to overcome the above limitations. 3D semiconductor memory devices may include memory cells three-dimensionally arranged.

SUMMARY

Embodiments of inventive concepts may provide a three-dimensional (3D) semiconductor memory device capable of improving reliability and integration density and/or an electronic system including the same.

In an embodiment, a 3D semiconductor memory device may include a peripheral circuit structure, an intermediate insulating layer and a cell array structure, which are sequentially stacked. The cell array structure may include a first substrate including a cell array region and a connection region, a stack structure comprising electrode layers and electrode interlayer insulating layers which are alternately stacked on the first substrate, a planarization insulating layer covering an end portion of the stack structure on the connection region, and a first through-via. The first through-via may penetrate the planarization insulating layer, the first substrate and the intermediate insulating layer and may connect one of the electrode layers to the peripheral circuit structure. The first through-via may include a first via portion and a second via portion integrally connected to each other. The first via portion may penetrate the planarization insulating layer and have a first width. The second via portion may penetrate the intermediate insulating layer and have a second width greater than the first width.

In another embodiment, a 3D semiconductor memory device may include a peripheral circuit structure, an intermediate insulating layer and a cell array structure, which are sequentially stacked. The cell array structure may include a first substrate including a cell array region and a connection region, a source structure on the first substrate, a stack structure comprising electrode layers and electrode interlayer insulating layers which are alternately stacked on the first substrate, a plurality of vertical patterns penetrating the stack structure and the source structure on the cell array region so as to be adjacent to the first substrate, a planarization insulating layer covering an end portion of the stack structure on the connection region, a first through-via, and a via insulating pattern surrounding a sidewall of the first through-via. The first through-via may penetrate the planarization insulating layer, the first substrate and the intermediate insulating layer and connect one of the electrode layers to the peripheral circuit structure. The via insulating pattern may include a first insulating portion and a second insulating portion. The first insulating portion may be between the first through-via and the planarization insulating layer and between the first through-via and an upper portion of the intermediate insulating layer. The second insulating portion may be between a lower portion of the first through-via and a lower portion of the intermediate insulating layer. The second insulating portion may laterally protrude from the first insulating portion. The second insulating portion may be between the upper portion of the intermediate insulating layer and the peripheral circuit structure.

In another embodiment, an electronic system may include a semiconductor device and a controller. The semiconductor device may include a peripheral circuit structure, an intermediate insulating layer and a cell array structure which are sequentially stacked; and an input/output pad electrically connected to the peripheral circuit structure. The controller may be electrically connected to the semiconductor device through the input/output pad and configured to control the semiconductor device. The cell array structure may include a first substrate including a cell array region and a connection region; a stack structure including electrode layers and electrode interlayer insulating layers which are alternately stacked on the first substrate; a planarization insulating layer covering an end portion of the stack structure on the connection region; and a first through-via. The first through-via may penetrate the planarization insulating layer, the first substrate and the intermediate insulating layer and may connect one of the electrode layers to the peripheral circuit structure. The planarization insulating layer may have a first through-hole having a first width, and the intermediate insulating layer may have a second through-hole having a second width greater than the first width. The first through-via may be in the first through-hole and the second through-hole.

BRIEF DESCRIPTION OF THE DRAWINGS

Inventive concepts will become more apparent in view of the attached drawings and accompanying detailed description.

DETAILED DESCRIPTION

Hereinafter, embodiments of inventive concepts will be described in more detail with reference to the accompanying drawings.

Figure 1A:
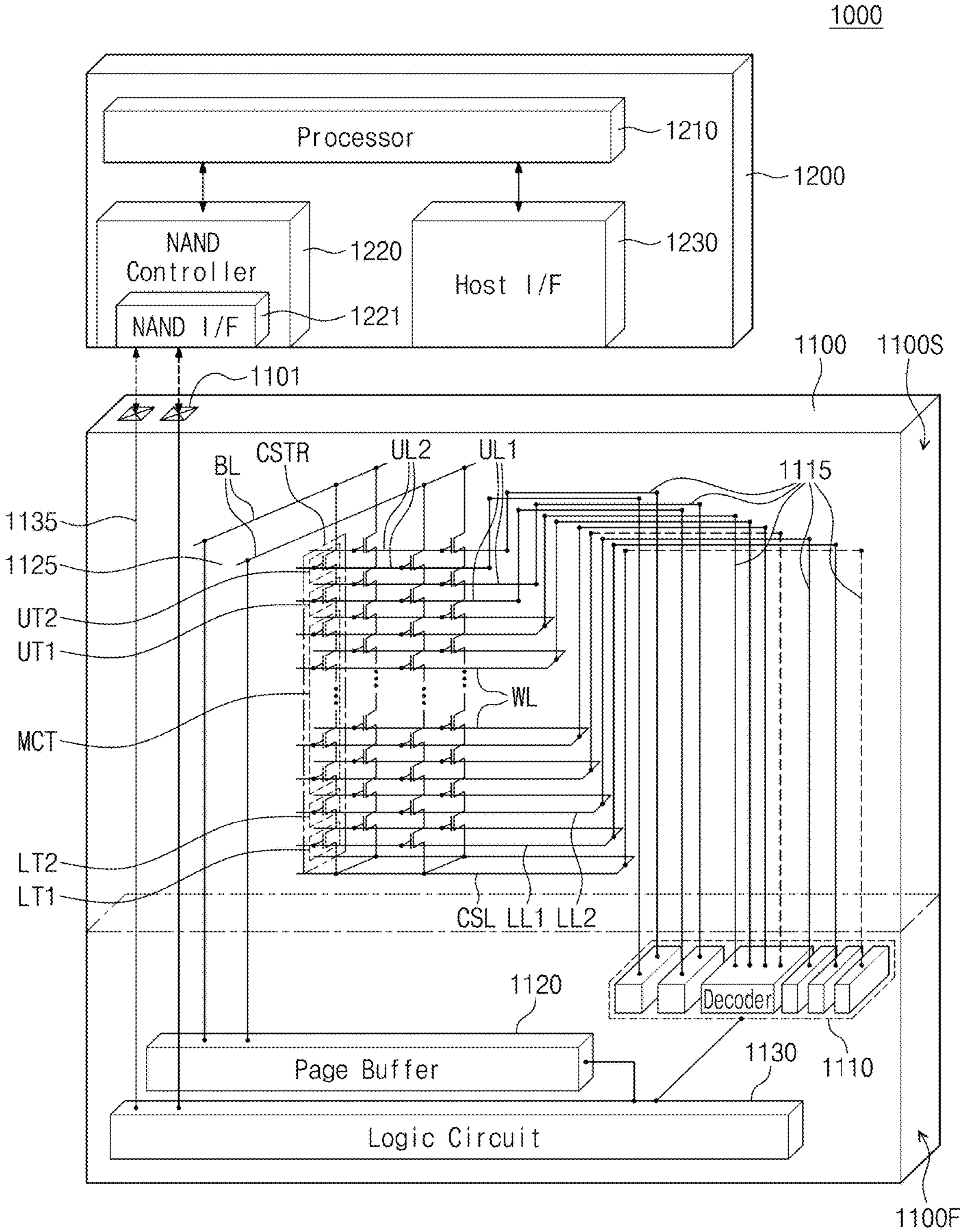
FIG. 1A is a schematic view illustrating an electronic system including a semiconductor device according to some embodiments of inventive concepts.

FIG. 1A is a schematic view illustrating an electronic system including a semiconductor device according to some embodiments of inventive concepts.

Referring to FIG. 1A, an electronic system 1000 according to some embodiments of inventive concepts may include a semiconductor device 1100 and a controller 1200 electrically connected to the semiconductor device 1100. The electronic system 1000 may be a storage device including one or more semiconductor devices 1100, or an electronic device including the storage device. For example, the electronic system 1000 may be a solid state drive (SSD) device, a universal serial bus (USB) device, a computing system, a medical device or a communication device, which includes the one or more semiconductor devices 1100.

The semiconductor device 1100 may be a non-volatile memory device, for example, a NAND flash memory device. The semiconductor device 1100 may include a first structure 1100F and a second structure 1100S on the first structure 1100F. In certain embodiments, the first structure 1100F may be disposed at a side of the second structure 1100S. The first structure 1100F may be a peripheral circuit structure including a decoder circuit 1110, a page buffer 1120, and a logic circuit 1130. The second structure 1100S may be a memory cell structure including bit lines BL, a common source line CSL, word lines WL, first and second gate upper lines UL1 and UL2, first and second gate lower lines LL1 and LL2, and memory cell strings CSTR between the common source line CSL and the bit lines BL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously changed.

In some embodiments, the upper transistors UT1 and UT2 may include a string selection transistor, and the lower transistors LT1 and LT2 may include a ground selection transistor. The gate lower lines LL1 and LL2 may be gate electrodes of the lower transistors LT1 and LT2, respectively. The word lines WL may be gate electrodes of the memory cell transistors MCT, respectively, and the gate upper lines UL1 and UL2 may be gate electrodes of the upper transistors UT1 and UT2, respectively.

In some embodiments, the lower transistors LT1 and LT2 may include a lower erase control transistor LT1 and a ground selection transistor LT2, which are connected in series to each other. The upper transistors UT1 and UT2 may include a string selection transistor UT1 and an upper erase control transistor UT2, which are connected in series to each other. At least one of the lower erase control transistor LT1 and the upper erase control transistor UT2 may be used in an erase operation for erasing data stored in the memory cell transistors MCT by using a gate induced drain leakage (GIDL) phenomenon.

The common source line CSL, the first and second gate lower lines LL1 and LL2, the word lines WL and the first and second gate upper lines UL1 and UL2 may be electrically connected to the decoder circuit 1110 through first connection wiring lines 1115 extending from the inside of the first structure 1100F into the second structure 1100S. The bit lines BL may be electrically connected to the page buffer 1120 through second connection wiring lines 1125 extending from the inside of the first structure 1100F into the second structure 1100S.

The decoder circuit 1110 and the page buffer 1120 of the first structure 1100F may perform a control operation on at least one selected among a plurality of the memory cell transistors MCT. The decoder circuit 1110 and the page buffer 1120 may be controlled by the logic circuit 1130. The semiconductor device 1000 may communicate with the controller 1200 through an input/output pad 1101 electrically connected to the logic circuit 1130. The input/output pad 1101 may be electrically connected to the logic circuit 1130 through an input/output connection wiring line 1135 extending from the inside of the first structure 1100F into the second structure 1100S.

The controller 1200 may include a processor 1210, a NAND controller 1220, and a host interface 1230. The electronic system 1000 may include a plurality of the semiconductor devices 1100 in some embodiments, and in this case, the controller 1200 may control the plurality of semiconductor devices 1000.

The processor 1210 may control overall operations of the electronic system 1000 including the controller 1200. The processor 1210 may operate according to desired and/or alternatively predetermined firmware and may control the NAND controller 1220 to access the semiconductor device 1100. The NAND controller 1220 may include a NAND interface 1221 for processing communication with the semiconductor device 1100. A control command for controlling the semiconductor device 1100, data to be written in the memory cell transistors MCT of the semiconductor device 1100, and data to be read from the memory cell transistors MCT of the semiconductor device 1100 may be transmitted through the NAND interface 1221. The host interface 1230 may provide a communication function between the electronic system 1000 and an external host. When a control command is received from the external host through the host interface 1230, the processor 1210 may control the semiconductor device 1100 in response to the control command.

Figure 1B:
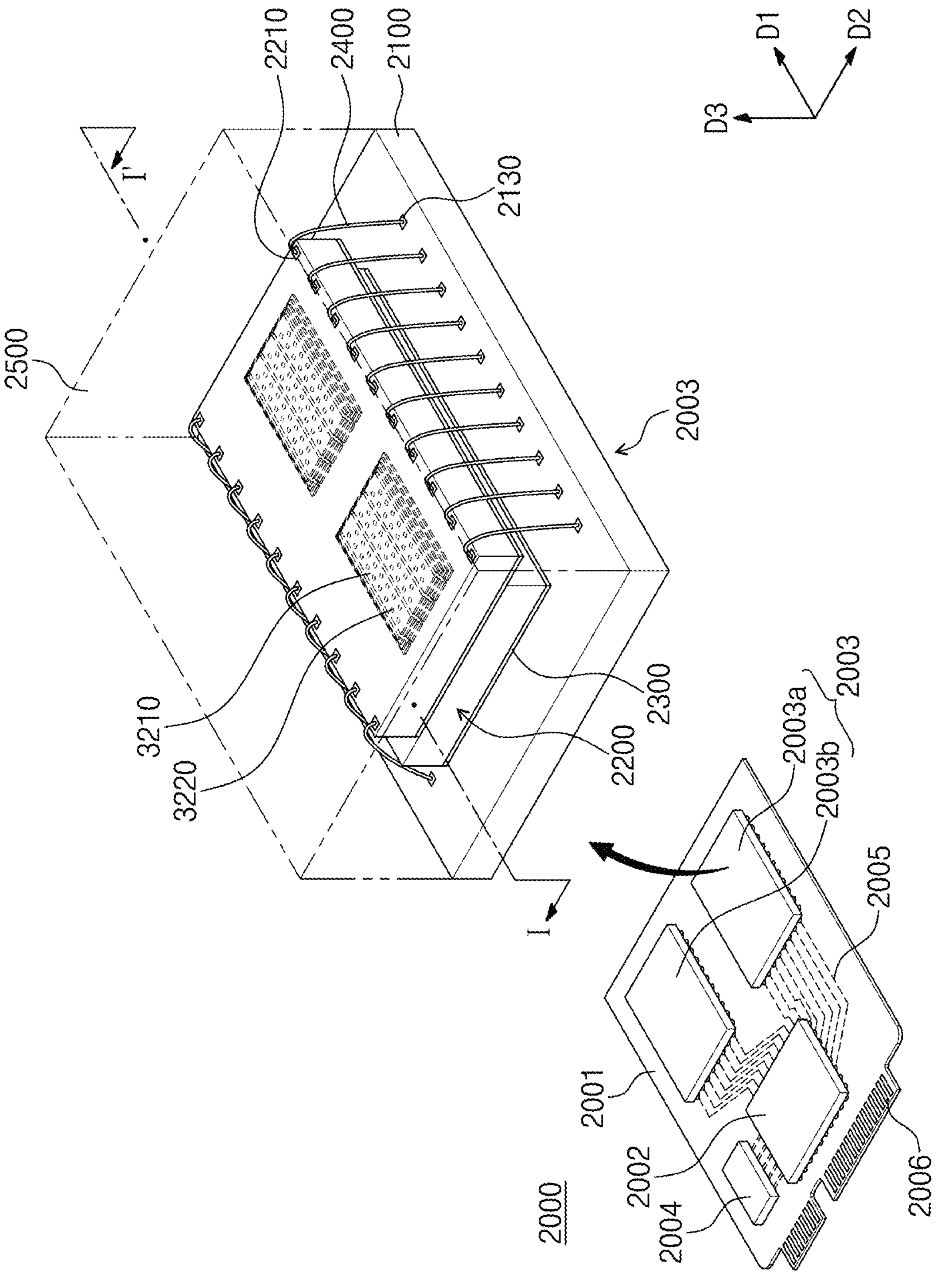
FIG. 1B is a perspective view schematically illustrating an electronic system including a semiconductor device according to some embodiments of inventive concepts.

FIG. 1B is a perspective view schematically illustrating an electronic system including a semiconductor device according to some embodiments of inventive concepts.

Referring to FIG. 1B, an electronic system 2000 according to some embodiments of inventive concepts may include a main board 2001, a controller 2002 mounted on the main board 2001, one or more semiconductor packages 2003, and a DRAM 2004. The semiconductor package 2003 and the DRAM 2004 may be connected to the controller 2002 through wiring patterns 2005 formed at the main board 2001.

The main board 2001 may include a connector 2006 including a plurality of pins coupled to an external host. The number and arrangement of the plurality of pins in the connector 2006 may be changed according to a communication interface between the electronic system 2000 and the external host. In some embodiments, the electronic system 2000 may communicate with the external host through one of a universal serial bus (USB) interface, a peripheral component interconnect express (PCI-express) interface, a serial advanced technology attachment (SATA) interface, and a M-Phy interface for an universal flash storage (UFS). In some embodiments, the electronic system 2000 may operate by power supplied from the external host through the connector 2006. The electronic system 2000 may further include a power management integrated circuit (PMIC) for distributing the power supplied from the external host to the controller 2002 and the semiconductor package 2003.

The controller 2002 may write data in the semiconductor package 2003 and/or read data from the semiconductor package 2003 and may improve an operation speed of the electronic system 2000.

The DRAM 2004 may be a buffer memory for reducing a speed difference between the external host and the semiconductor package 2003 corresponding to a data storage space. The DRAM 2004 included in the electronic system 2000 may also operate as a cache memory and may provide a space for temporarily storing data in an operation of controlling the semiconductor package 2003. In the case in which the electronic system 2000 includes the DRAM 2004, the controller 2002 may further include a DRAM controller for controlling the DRAM 2004 in addition to a NAND controller for controlling the semiconductor package 2003.

The semiconductor package 2003 may include first and second semiconductor packages 2003*a* and 2003*b* spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, the semiconductor chips 2200 on the package substrate 2100, adhesive layers 2300 disposed on bottom surfaces of the semiconductor chips 2200, respectively, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be a printed circuit board including package upper pads 2130. Each of the semiconductor chips 2200 may include an input/output pad 2210. The input/output pad 2210 may correspond to the input/output pad 1101 of FIG. 1A. Each of the semiconductor chips 2200 may include gate stack structures 3210 and vertical structures 3220. Each of the semiconductor chips 2200 may include a semiconductor device (e.g., a three-dimensional (3D) semiconductor memory device) according to some embodiments of inventive concepts, which will be described later.

In some embodiments, the connection structure 2400 may be a bonding wire electrically connecting the input/output pad 2210 to the package upper pad 2130. Thus, in each of the first and second semiconductor packages 2003*a* and 2003*b*, the semiconductor chips 2200 may be electrically connected to each other by the bonding wire method and may be electrically connected to the package upper pads 2130 of the package substrate 2100 by the bonding wire method. According to certain embodiments, in each of the first and second semiconductor packages 2003*a* and 2003*b*, the semiconductor chips 2200 may be electrically connected to each other by a connection structure including a through-silicon via (TSV), instead of the connection structure 2400 having the bonding wire.

In some embodiments, the controller 2002 and the semiconductor chips 2200 may be included in a single package. For example, the controller 2002 and the semiconductor chips 2200 may be mounted on an interposer substrate different from the main board 2001, and the controller 2002 and the semiconductor chips 2200 may be connected to each other by wiring lines formed at the interposer substrate.

Figure 1C:
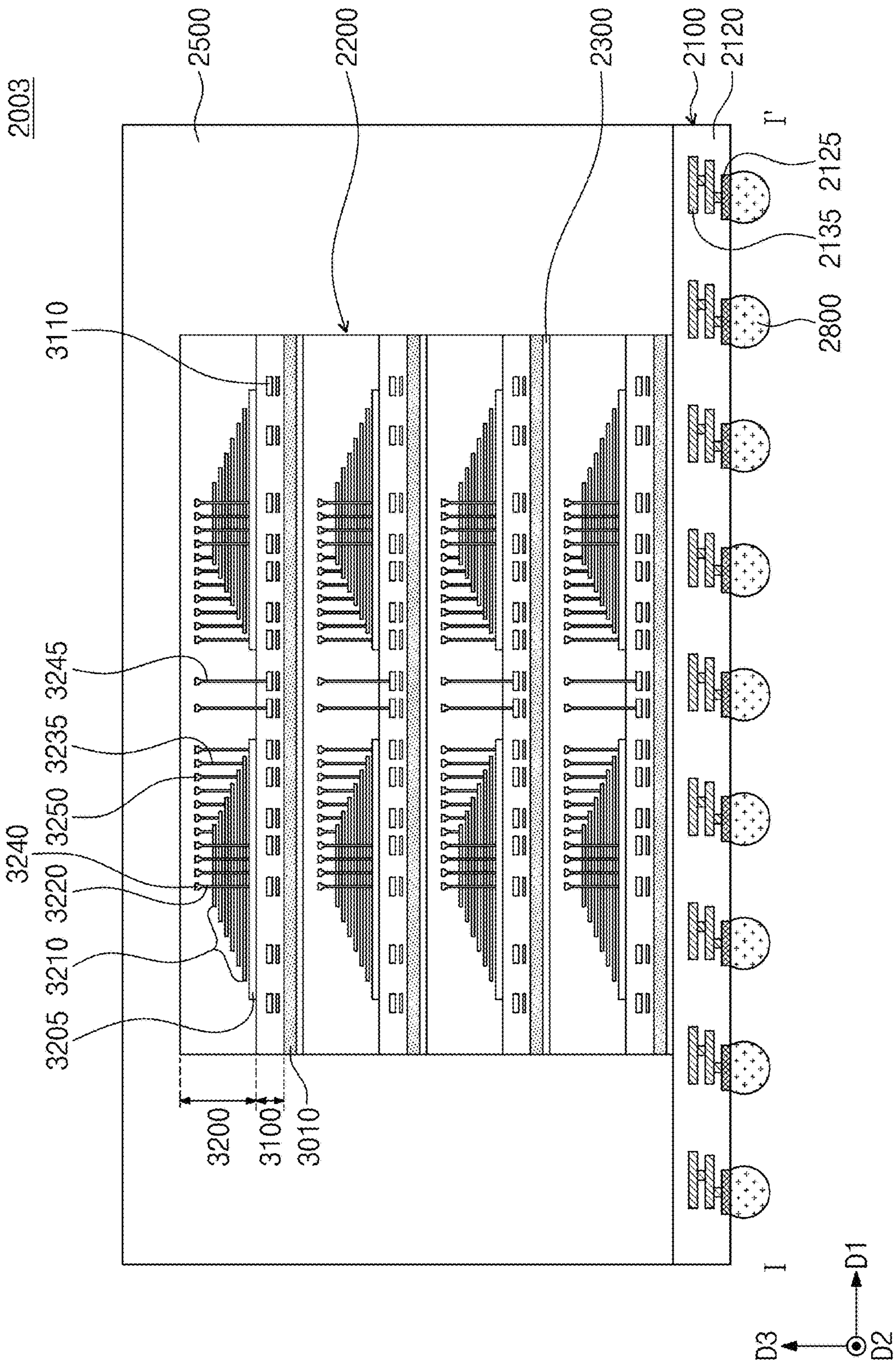
FIGS. 1C and 1D are cross-sectional views schematically illustrating semiconductor packages according to some embodiments of inventive concepts.
Figure 1D:
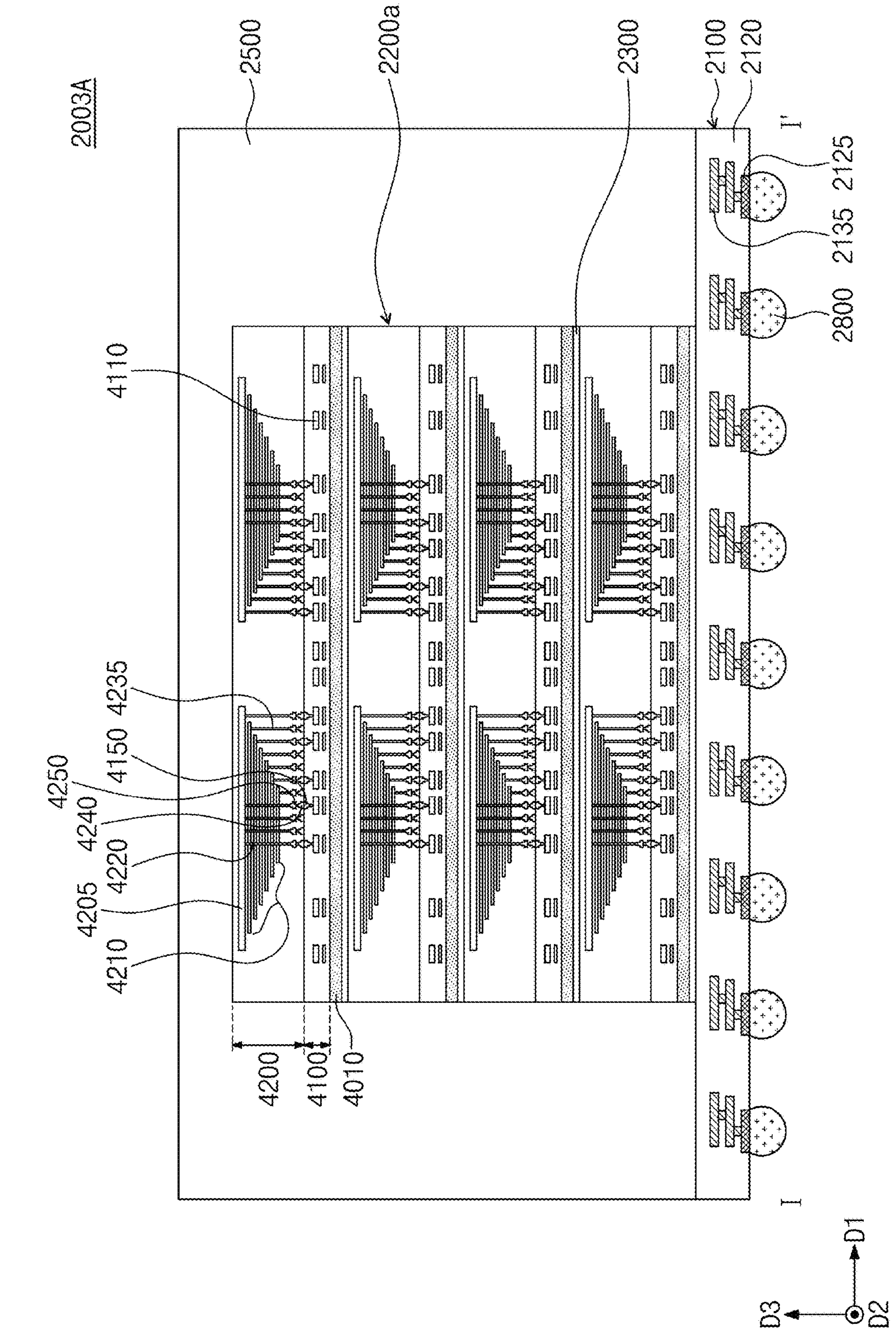

FIGS. 1C and 1D are cross-sectional views schematically illustrating semiconductor packages according to some embodiments of inventive concepts. FIGS. 1C and 1D are cross-sectional views taken along a line I-I' of FIG. 1B to illustrate example embodiments of a semiconductor package of FIG. 1B.

Referring to FIG. 1C, in the semiconductor package 2003, the package substrate 2100 may be a printed circuit board. The package substrate 2100 may include a package substrate body portion 2120, the package upper pads 2130 (see FIG. 1B) disposed on a top surface of the package substrate body portion 2120, package lower pads 2125 disposed on or exposed by a bottom surface of the package substrate body portion 2120, and internal wiring lines 2135 disposed in the package substrate body portion 2120 to electrically connect the package upper pads 2130 to the package lower pads 2125. The package upper pads 2130 may be electrically connected to the connection structures 2400. The package lower pads 2125 may be connected to the wiring patterns 2005 of the main board 2001 of the electronic system 2000 of FIG. 1B through conductive connection portions 2800.

Each of the semiconductor chips 2200 may include a semiconductor substrate 3010, and first and second structures 3100 and 3200 sequentially stacked on the semiconductor substrate 3010. The first structure 3100 may include a peripheral circuit region including peripheral wiring lines 3110. The second structure 3200 may include a source structure 3205, a stack structure 3210 on the source structure 3205, vertical structures 3220 penetrating the stack structure 3210, bit lines 3240 electrically connected to the vertical structures 3220, and cell contact plugs 3235 electrically connected to word lines (see WL of FIG. 1A) of the stack structure 3210. The first structure 3100/the second structure 3200/the semiconductor chip 2200 may further include separation structures to be described later.

Each of the semiconductor chips 2200 may include a through-wiring line 3245 which is electrically connected to the peripheral wiring line 3110 of the first structure 3100 and extends into the second structure 3200. The through-wiring line 3245 may be disposed outside the stack structure 3210 and may further be disposed to penetrate the stack structure 3210. Each of the semiconductor chips 2200 may further include the input/output pad 2210 (see FIG. 1B) electrically connected to the peripheral wiring lines 3110 of the first structure 3100.

Referring to FIG. 1D, in a semiconductor package 2003A, each of semiconductor chips 2200*a* may include a semiconductor substrate 4010, a first structure 4100 on the semiconductor substrate 4010, and a second structure 4200 disposed on the first structure 4100 and bonded to the first structure 4100 by a wafer bonding method.

The first structure 4100 may include a peripheral circuit region including peripheral wiring lines 4110 and first bonding structures 4150. The second structure 4200 may include a source structure 4205, a stack structure 4210 between the source structure 4205 and the first structure 4100, vertical structures 4220 penetrating the stack structure 4210, and second bonding structures 4250 electrically connected to the vertical structures 4220 and word lines (see WL of FIG. 1A) of the stack structure 4210, respectively. For example, the second bonding structures 4250 may be electrically connected to the vertical structures 4220 and the word lines (see WL of FIG. 1A) through bit lines 4240 electrically connected to the vertical structures 4220 and cell contact plugs 4235 electrically connected to the word lines (see WL of FIG. 1A), respectively. The first bonding structures 4150 of the first structure 4100 may be in contact with and bonded to the second bonding structures 4250 of the second structure 4200. Bonded portions of the first bonding structures 4150 and the second bonding structures 4250 may be formed of, for example, copper (Cu).

The first structure 4100, the second structure 4200, and the semiconductor chip 2200*a* may include a source structure according to embodiments to be described later. Each of the semiconductor chips 2200*a* may further include the input/output pad 2210 (see FIG. 1B) electrically connected to the peripheral wiring lines 4110 of the first structure 4100.

The semiconductor chips 2200 of FIG. 1C (or the semiconductor chips 2200*a* of FIG. 1D) may be electrically connected to each other by the connection structures 2400 having the bonding wire shapes. In certain embodiments, semiconductor chips (e.g., the semiconductor chips 2200 of FIG. 1C or the semiconductor chips 2200*a* of FIG. 1D) in the same semiconductor package may be electrically connected to each other by connection structures including through-silicon vias (TSVs).

The first structure 3100 of FIG. 1C and the first structure 4100 of FIG. 1D may correspond to a peripheral circuit structure in embodiments to be described below, and the second structure 3200 of FIG. 1C and the second structure 4200 of FIG. 1D may correspond to a cell array structure in embodiments to be described below.

Figure 2:
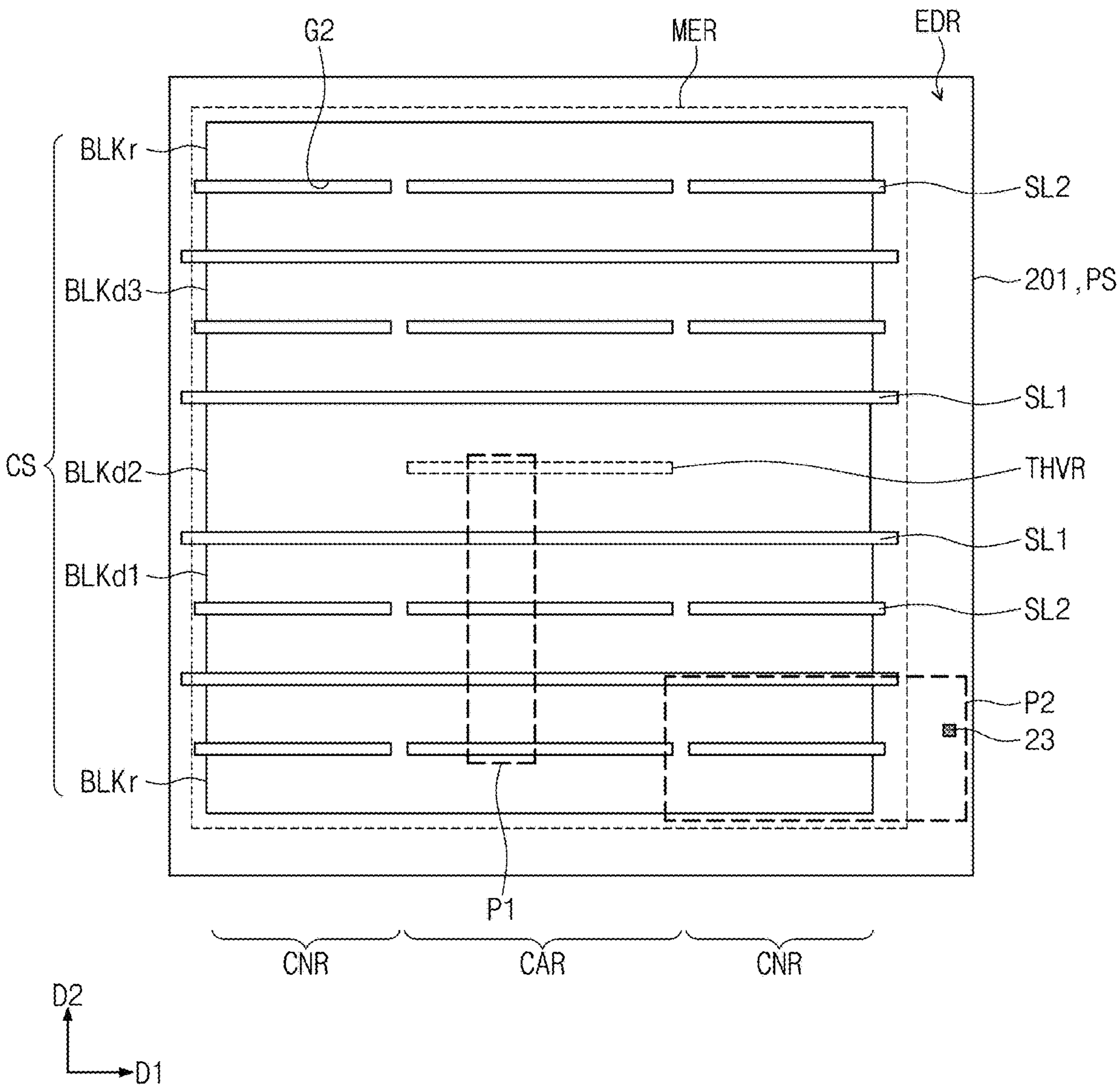
FIG. 2 is a plan view illustrating a three-dimensional (3D) semiconductor memory device according to some embodiments of inventive concepts.
Figure 3A:
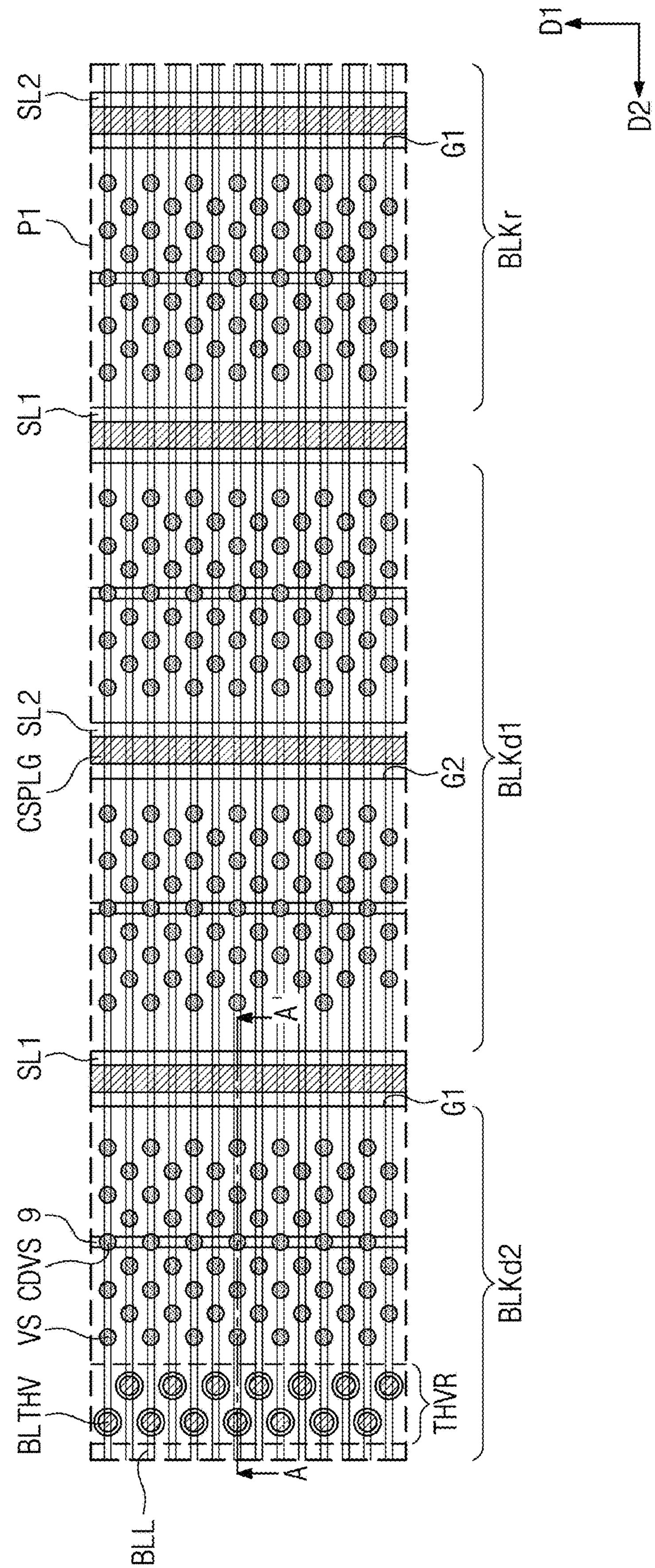
FIG. 3A is an enlarged plan view of a portion 'P1' of FIG. 2.
Figure 3B:
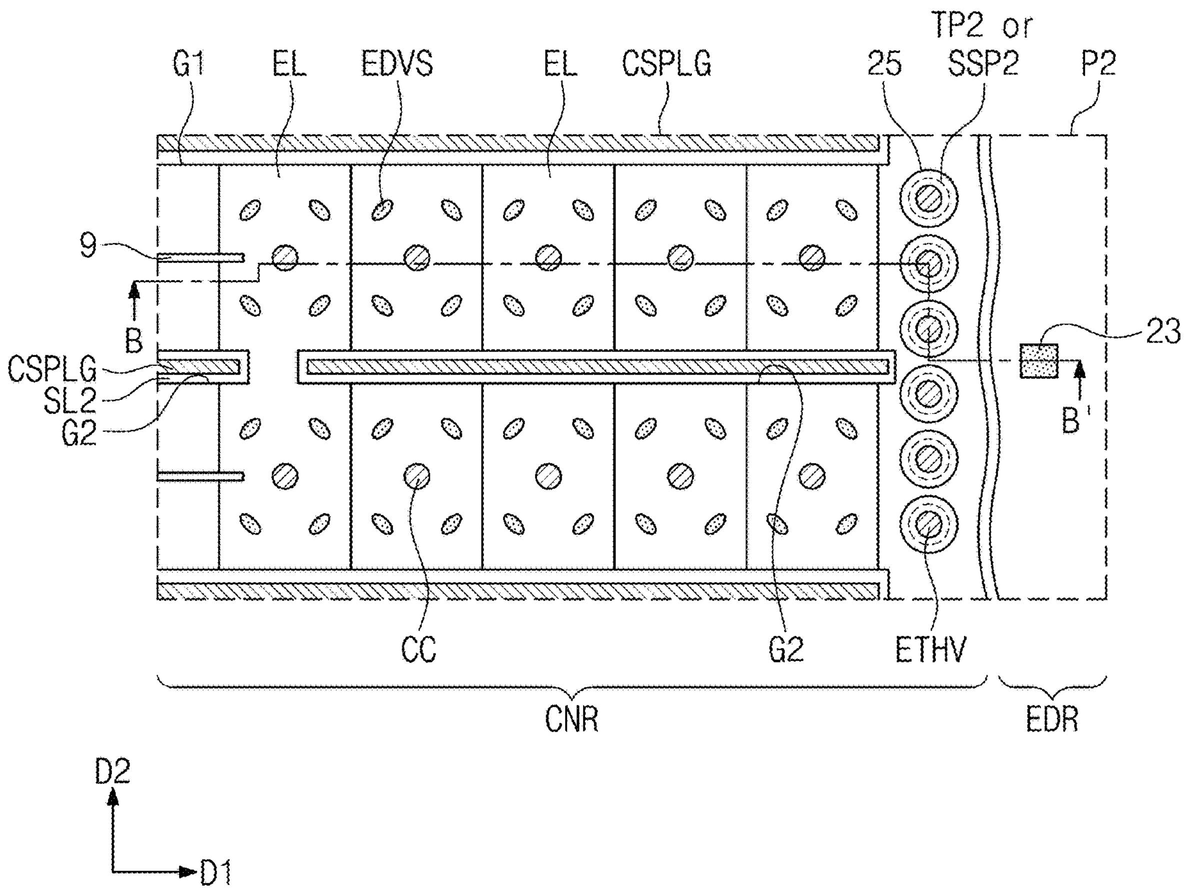
FIG. 3B is an enlarged plan view of a portion 'P2' of FIG. 2.
Figure 4A:
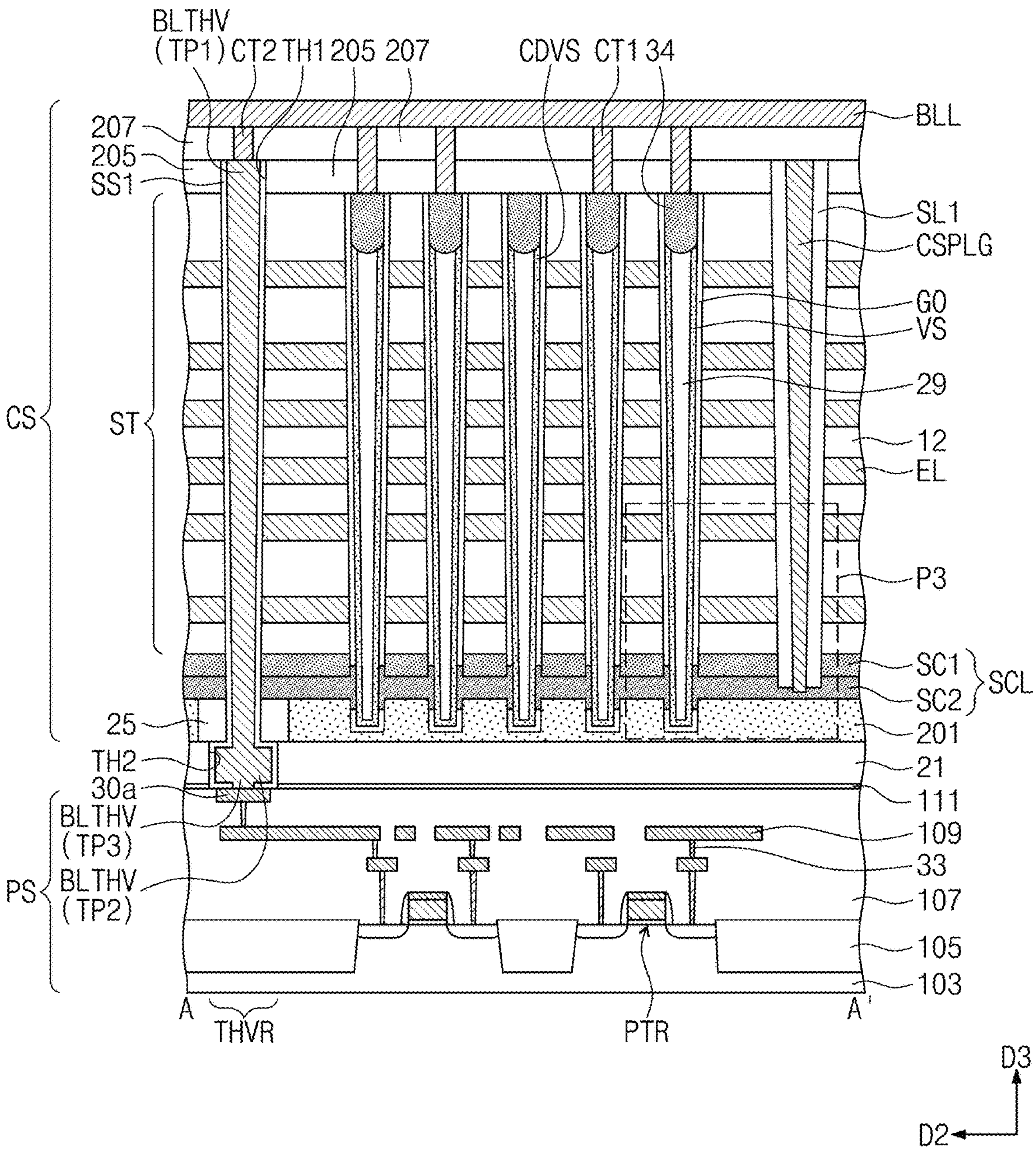
FIG. 4A is a cross-sectional view taken along a line A-A' of FIG. 3A according to some embodiments of inventive concepts.
Figure 4B:
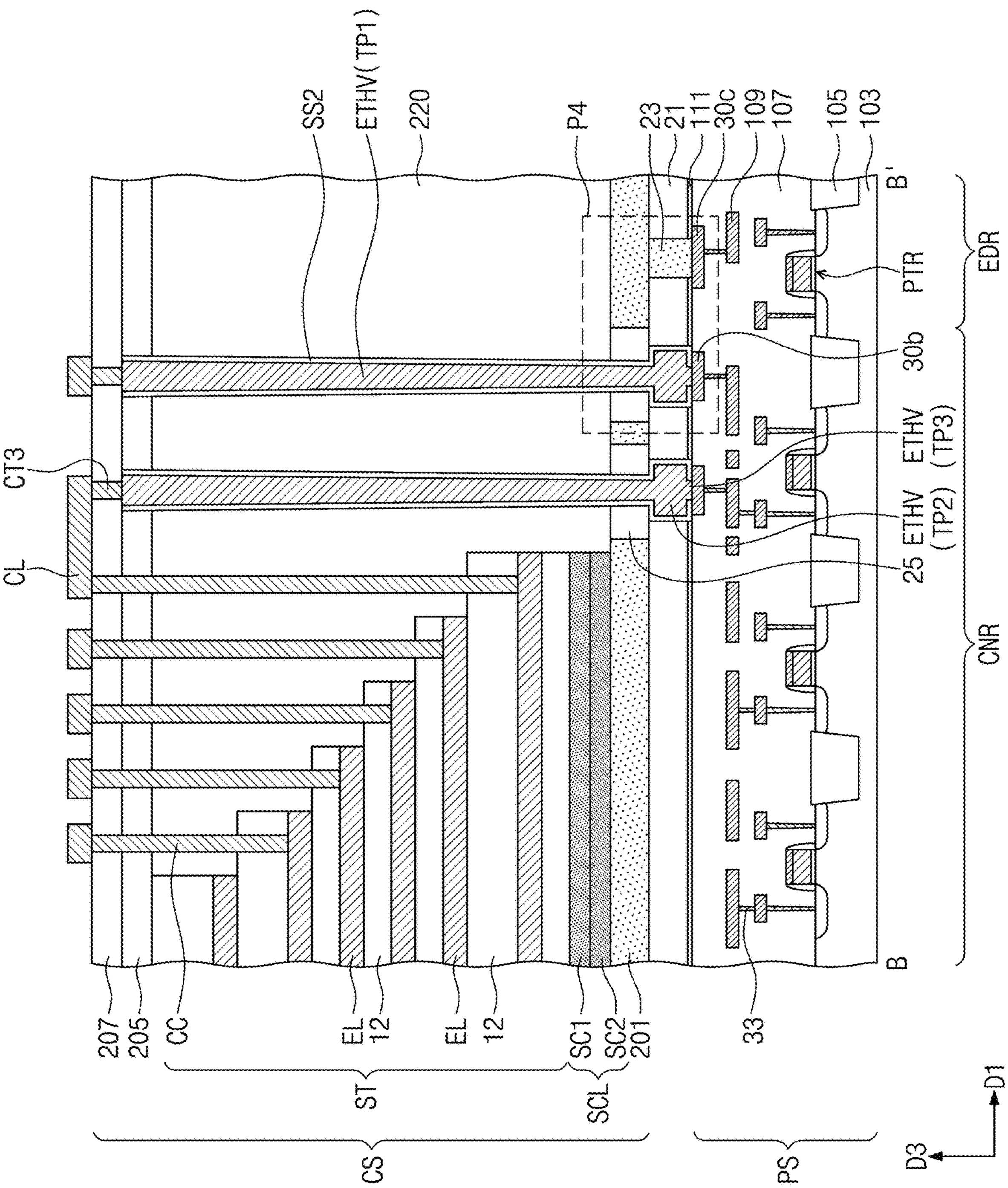
FIG. 4B is a cross-sectional view taken along a line B-B' of FIG. 3B according to some embodiments of inventive concepts.
Figure 5A:
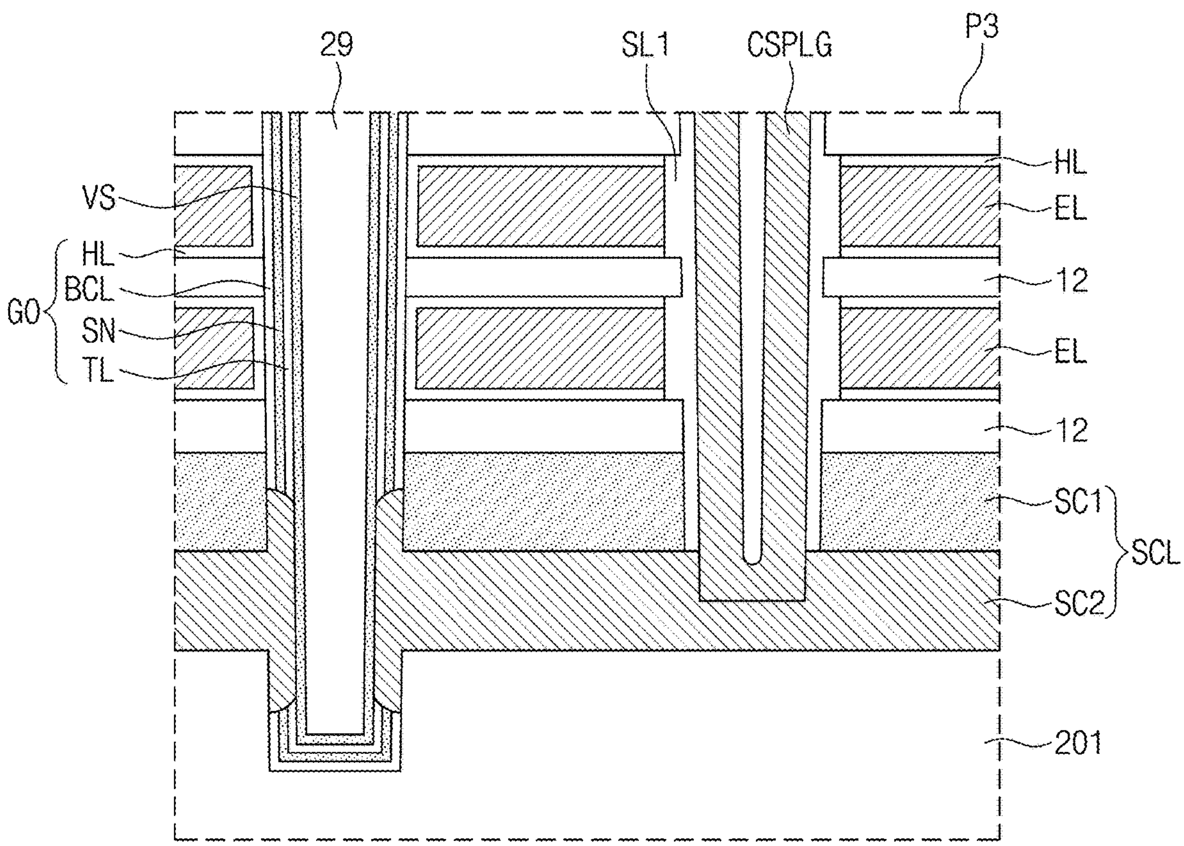
FIG. 5A is an enlarged view of a portion 'P3' of FIG. 4A.
Figure 5B:
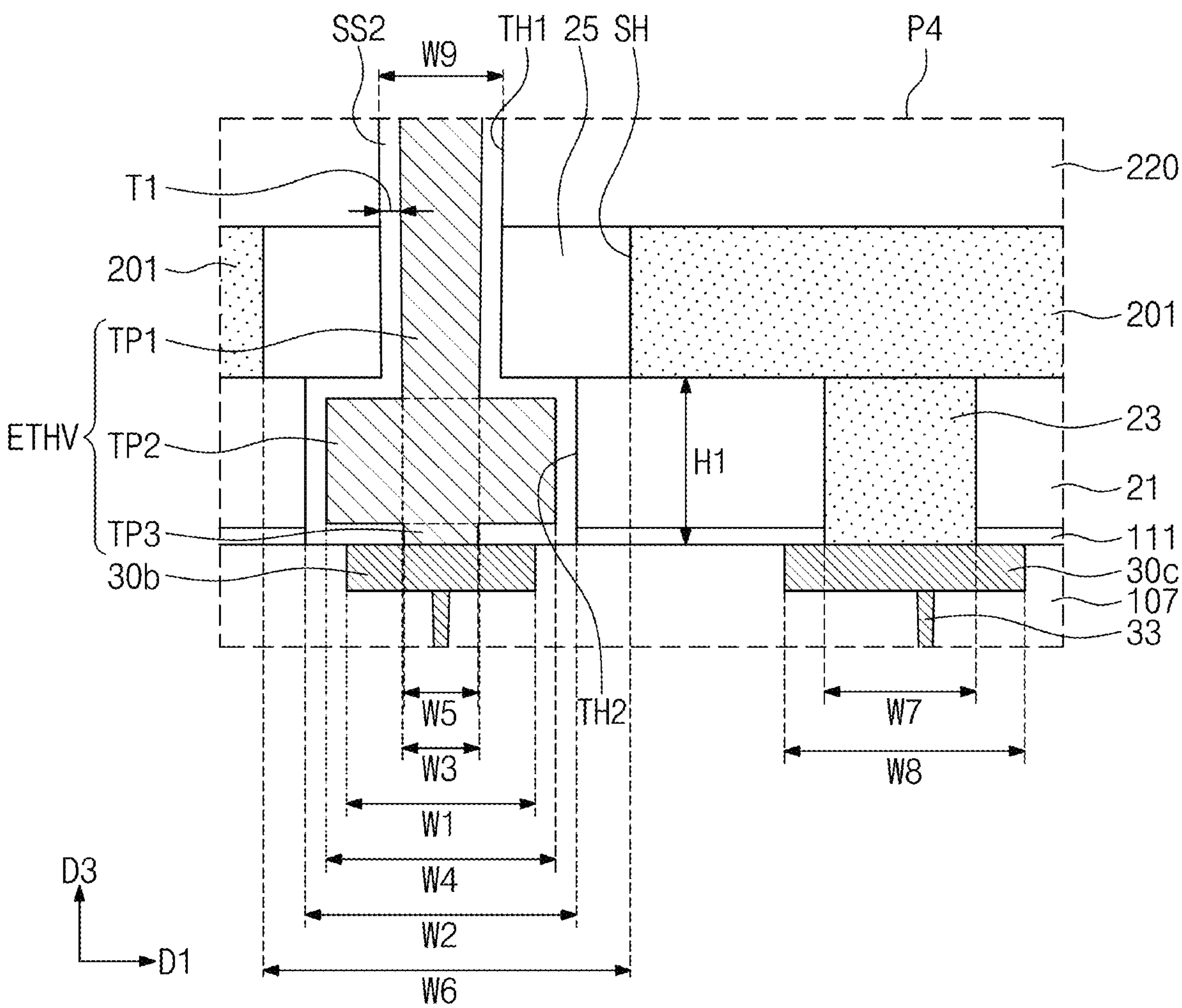
FIG. 5B is an enlarged view of a portion 'P4' of FIG. 4B.

FIG. 2 is a plan view illustrating a 3D semiconductor memory device according to some embodiments of inventive concepts. FIG. 3A is an enlarged plan view of a portion 'P1' of FIG. 2. FIG. 3B is an enlarged plan view of a portion 'P2' of FIG. 2. FIG. 4A is a cross-sectional view taken along a line A-A' of FIG. 3A according to some embodiments of inventive concepts. FIG. 4B is a cross-sectional view taken along a line B-B' of FIG. 3B according to some embodiments of inventive concepts. FIG. 5A is an enlarged view of a portion 'P3' of FIG. 4A. FIG. 5B is an enlarged view of a portion 'P4' of FIG. 4B.

Referring to FIGS. 2, 3A and 3B, a cell array structure CS may be disposed on a peripheral circuit structure PS. The cell array structure CS may include a memory region MER and an edge region EDR surrounding the memory region MER when viewed in a plan view. In the memory region MER, the cell array structure CS may include real blocks BLKr arranged in a second direction D2. The real blocks BLKr may be memory blocks capable of actually performing write/erase/read operations of data. Dummy blocks BLKd1 to BLKd3 may be disposed between adjacent two, disposed at desired and/or alternatively predetermined positions, of the real blocks BLKr. The dummy blocks BLKd1 to BLKd3 may include first to third dummy blocks BLKd1 to BLKd3 arranged in the second direction D2. The dummy blocks BLKd1 to BLKd3 may not function as memory blocks. In other words, write/erase/read operations of data may not be performed on the dummy blocks BLKd1 to BLKd3.

Referring to FIG. 2, first separation insulating patterns SL1 may be disposed between the blocks BLKr and BLKd1 to BLKd3, respectively. The first separation insulating pattern SL1 may be disposed in a first groove region G1. The first separation insulating pattern SL1 may have a line shape extending in a first direction D1. The first separation insulating patterns SL1 may have a single-layered or multi-layered structure including at least one of a silicon oxide layer, a silicon nitride layer, a silicon oxynitride layer, or a porous insulating layer. Each of the blocks BLKr and BLKd1 to BLKd3 may include a cell array region CAR and connection regions CNR disposed at both ends of the cell array region CAR.

Each of the real blocks BLKr and the first and third dummy blocks BLKd1 and BLKd3 may have second grooves G2 in the cell array region CAR and the connection regions CNR. In each of the real blocks BLKr and the first and third dummy blocks BLKd1 and BLKd3, the second grooves G2 may be arranged in the first direction D1 and may be spaced apart from each other. A second separation insulating pattern SL2 may be disposed in each of the second grooves G2. The second dummy block BLKd2 may not have the second groove G2. The second dummy block BLKd2 may further include a central through-via region THVR disposed in the cell array region CAR.

Referring to FIGS. 3A, 3B, 4A and 4B, the peripheral circuit structure PS may include a first substrate 103. The first substrate 103 may be a single-crystalline silicon substrate or a silicon-on-insulator (SOI) substrate. A device isolation layer 105 may be disposed in the first substrate 103 to define active regions. Peripheral transistors PTR may be disposed on the active regions. Each of the peripheral transistors PTR may include a peripheral gate electrode, a peripheral gate insulating layer, and peripheral source/drain regions disposed in the first substrate 103 at both sides of the peripheral gate electrode. The peripheral transistors PTR may be covered with a peripheral interlayer insulating layer 107. The peripheral interlayer insulating layer 107 may have a single-layered or multi-layered structure including at least one of a silicon oxide layer, a silicon nitride layer, a silicon oxynitride layer, or a porous insulating layer. Peripheral wiring lines 109 and peripheral contacts 33 may be disposed in the peripheral interlayer insulating layer 107. The peripheral wiring lines 109 and the peripheral contacts 33 may include a conductive material.

Some of the peripheral wiring lines 109 and some of the peripheral contacts 33 may be electrically connected to the peripheral transistors PTR. The peripheral wiring lines 109 and the peripheral transistors PTR may constitute the page buffer 1120 and the decode circuit 1110 of FIG. 1A. The peripheral circuit structure PS may include first to third peripheral conductive pads 30*a*, 30*b* and 30*c* disposed at its top end.

An etch stop layer 111 and an intermediate insulating layer 21 may be sequentially stacked on the peripheral circuit structure PS. The etch stop layer 111 may include a material having an etch selectivity with respect to the intermediate insulating layer 21. For example, the etch stop layer 111 may include a silicon nitride layer. The intermediate insulating layer 21 may include a silicon oxide layer.

The cell array structure CS may be disposed on the intermediate insulating layer 21. Each of the blocks BLKr and BLKd1 to BLKd3 included in the cell array structure CS may include a second substrate 201, a source structure SCL, a stack structure ST and first and second upper insulating layers 205 and 207, which are sequentially stacked. The stack structure ST may include electrode layers EL and electrode interlayer insulating layers 12, which are alternately stacked. For example, the second substrate 201 may be a single-crystalline silicon layer, a silicon epitaxial layer, or a SOI substrate. For example, the second substrate 201 may be doped with dopants of a first conductivity type. For example, the dopants of the first conductivity type may be boron (a P-type). Alternatively, the dopants of the first conductivity type may be arsenic or phosphorus (an N-type).

A lowermost one of the electrode layers EL may correspond to the gate lower lines LL1 and LL2 of FIG. 1A. An uppermost one of the electrode layers EL may correspond to the gate upper lines UL1 and UL2 of FIG. 1A. At least one electrode layer EL located at an uppermost position in one of the blocks BLKr and BLKd1 to BLKd3 may be divided into a plurality of lines by a central separation pattern 9 and the second groove G2, and the plurality of lines may form the gate upper lines UL1 and UL2. Other electrode layers EL may correspond to the word lines WL of FIG. 1A.

For example, the electrode layers EL may include at least one of a doped semiconductor material (e.g., doped silicon), a metal (e.g., tungsten, copper, or aluminum), a conductive metal nitride (e.g., titanium nitride or tantalum nitride), or a transition metal (e.g., titanium or tantalum). Each of the electrode interlayer insulating layers 12 may include a single layer or multi-layer including at least one of a silicon oxide layer, a silicon nitride layer, a silicon oxynitride layer, or a porous insulating layer.

The source structure SCL may include a first source pattern SC1 disposed between a lowermost electrode interlayer insulating layer 12 and the second substrate 201, and a second source pattern SC2 disposed between the first source pattern SC1 and the second substrate 201. The first source pattern SC1 may include a semiconductor pattern doped with dopants, for example, poly-silicon doped with dopants of the first conductivity type or a second conductivity opposite to the first conductivity. The second source pattern SC2 may include a semiconductor pattern doped with dopants, for example, poly-silicon doped with dopants. The second source pattern SC2 may further include a different semiconductor material from that of the first source pattern SC1. A conductivity type of the dopants doped in the second source pattern SC2 may be the same as the conductivity type of the dopants doped in the first source pattern SC1. A concentration of the dopants doped in the second source pattern SC2 may be equal to or different from a concentration of the dopants doped in the first source pattern SC1. The source structure SCL may correspond to the common source line CSL of FIG. 1A.

Referring to FIGS. 3A and 4A, vertical semiconductor patterns VS and center dummy vertical patterns CDVS may penetrate the electrode interlayer insulating layers 12 and the electrode layers EL in the cell array region CAR of each of the blocks BLKr and BLKd1 to BLKd3. The center dummy vertical patterns CDVS may be arranged in a line along the first direction D1. The central separation pattern 9 may be disposed between upper portions of the center dummy vertical patterns CDVS. A gate insulating layer GO may be disposed between the electrode layers EL and the vertical semiconductor patterns VS and between the electrode layers EL and the center dummy vertical patterns CDVS. The vertical semiconductor patterns VS and the center dummy vertical patterns CDVS may have hollow cup shapes. The vertical semiconductor patterns VS and the center dummy vertical patterns CDVS may include, for example, single-crystalline silicon or poly-silicon.

A filling insulation pattern 29 may fill the inside of each of the vertical semiconductor patterns VS and the center dummy vertical patterns CDVS. For example, the filling insulation pattern 29 may have a single-layered or multi-layered structure including at least one of a silicon oxide layer, a silicon nitride layer, or a silicon oxynitride layer. Bit line pads 34 may be disposed on the vertical semiconductor patterns VS and the center dummy vertical patterns CDVS, respectively. The bit line pad 34 may include poly-silicon doped with dopants and/or a metal (e.g., tungsten, aluminum, or copper). The second source pattern SC2 may penetrate the gate insulating layer GO so as to be in contact with sidewalls of lower portions of the vertical semiconductor patterns VS and the center dummy vertical patterns CDVS.

Referring to FIGS. 4A and 5A, the gate insulating layer GO may include a tunnel insulating layer TL, a charge storage layer SN, and a blocking insulating layer BCL. The charge storage layer SN may include a trap insulating layer, a floating gate electrode, and/or an insulating layer including conductive nano dots. For example, the charge storage layer SN may include at least one of a silicon nitride layer, a silicon oxynitride layer, a silicon-rich nitride layer, a nano-crystalline silicon layer, or a laminated trap layer. The tunnel insulating layer TL may include at least one of materials having energy band gaps greater than that of the charge storage layer SN, and the blocking insulating layer BCL may include a high-k dielectric layer such as an aluminum oxide layer or a hafnium oxide layer. The gate insulating layer GO may further include a high-k dielectric layer HL. The high-k dielectric layer HL may be disposed between the blocking insulating layer BCL and the electrode layers EL. The high-k dielectric layer HL may also be disposed between the electrode layers EL and the electrode interlayer insulating layers 12. The high-k dielectric layer HL may have a dielectric constant higher than that of a silicon oxide layer and may include, for example, a metal oxide layer such as a hafnium oxide layer or an aluminum oxide layer. A lower portion of the gate insulating layer GO may be separated from an upper portion of the gate insulating layer GO by the second source pattern SC2. A portion of the first separation insulating pattern SL1 may protrude toward the electrode layer EL in parallel to the second direction D2 so as to be disposed between the electrode interlayer insulating layers 12 adjacent to each other. A sidewall of the first separation insulating pattern SL1 may have an uneven structure. A shape of a sidewall of the second separation insulating pattern SL2 may be the same/similar as that of the sidewall of the first separation insulating pattern SL1.

Each of the first separation insulating patterns SL1 and the second separation insulating patterns SL2 may penetrate the first upper insulating layer 205 and the stack structure ST. A source contact line CSPLG may be disposed in each of the first separation insulating patterns SL1 and the second separation insulating patterns SL2. The source contact line CSPLG may include a conductive material. The source contact lines CSPLG may be in contact with the second source pattern SC2 of the source structure SCL. Each of the source contact lines CSPLG may have a line shape extending in the first direction D1 along each of the first and second separation insulating patterns SL1 and SL2 when viewed in a plan view. Even though not shown in the drawings, in certain embodiments, each of the source contact lines CSPLG may have a plurality of contact plug shapes spaced apart from each other, not the line shape.

Referring to FIGS. 3A and 4A, bit line through-vias BLTHV may be disposed in the central through-via region THVR of the second dummy block BLKd2. The bit line through-vias BLTHV may penetrate the first upper insulating layer 205, the stack structure ST, the source structure SCL, the second substrate 201, the intermediate insulating layer 21 and the etch stop layer 111 so as to be in contact with the first peripheral conductive pads 30*a*, respectively. Substrate insulating patterns 25 may be disposed between the second substrate 201 and the bit line through-vias BLTHV. A first via insulating pattern SS1 may be disposed between the bit line through-via BLTHV and the stack structure ST, between the bit line through-via BLTHV and the source structure SCL, between the bit line through-via BLTHV and the substrate insulating pattern 25, between the bit line through-via BLTHV and the intermediate insulating layer 21, and between the bit line through-via BLTHV and the etch stop layer 111. The bit line through-vias BLTHV may be arranged in a zigzag form in the first direction D1.

Referring to FIGS. 3A and 4A, the second upper insulating layer 207 may be disposed on the first upper insulating layer 205. First conductive lines BLL extending in the second direction D2 in parallel to each other may be disposed on the second upper insulating layer 207. The first conductive lines BLL may correspond to the bit lines BL of FIG. 1A. First contacts CT1 may penetrate the first and second upper insulating layers 205 and 207 to connect the bit line pads 34 disposed on the vertical semiconductor patterns VS to the first conductive lines BLL. The first contacts CT1 may not be disposed on the bit line pad 34 disposed on the center dummy vertical pattern CDVS. A second contact CT2 may penetrate the second upper insulating layer 207 to connect the bit line through-via BLTHV to one of the first conductive lines BLL. Thus, the vertical semiconductor patterns VS may be connected to the first conductive lines BLL. The first conductive lines BLL may be electrically connected to the page buffer (see 1120 of FIG. 1A) of the peripheral circuit structure PS through the bit line through-vias BLTHV.

Referring to FIGS. 3B and 4B, the stack structure ST included in each of the blocks BLKr and BLKd1 to BLKd3 may have a staircase shape in the connection region CNR. In other words, the electrode layers EL and the electrode interlayer insulating layers 12 may have a staircase shape in the connection region CNR. Lengths, in the first direction D1, of the electrode layers EL and the electrode interlayer insulating layers 12 may sequentially increase as a distance from the peripheral circuit structure PS decreases. A planarization insulating layer 220 may cover an end portion of the stack structure ST, which forms the staircase shape. The planarization insulating layer 220 may include a silicon oxide layer or a porous insulating layer. The first upper insulating layer 205 and the second upper insulating layer 207 may be sequentially stacked on the planarization insulating layer 220. End portions of the electrode layers EL may be connected to cell contact plugs CC, respectively. The cell contact plugs CC may penetrate the second upper insulating layer 207, the first upper insulating layer 205 and the electrode interlayer insulating layers 12 so as to be in contact with the electrode layers EL, respectively.

Referring to FIG. 3B, edge dummy vertical patterns EDVS may penetrate the planarization insulating layer 220 and the end portions of the electrode layers EL and the electrode interlayer insulating layers 12, which forms the staircase shape. Each of the edge dummy vertical patterns EDVS may have an elliptical shape elongated in a desired and/or alternatively predetermined direction when viewed in a plan view. A cross section of the edge dummy vertical pattern EDVS may be the same/similar as that of the vertical semiconductor pattern VS or the center dummy vertical pattern CDVS of FIG. 4A. The inside of each of the edge dummy vertical patterns EDVS may also be filled with the filling insulation pattern 29. The gate insulating layer GO may also be disposed between the edge dummy vertical patterns EDVS and the electrode layers EL.

Referring to FIG. 4B, second conductive lines CL may be disposed on the second upper insulating layer 207. In the connection region CNR, edge through-vias ETHV may penetrate the first upper insulating layer 205, the planarization insulating layer 220, the second substrate 201, the intermediate insulating layer 21 and the etch stop layer 111 so as to be in contact with the second peripheral conductive pads 30*b*, respectively. In the present embodiments, the edge through-vias ETHV may be spaced apart from the stack structure ST. The edge through-vias ETHV may be connected to the second conductive lines CL through third contacts CT3 disposed in the second upper insulating layer 207, respectively. Thus, the electrode layers EL may be connected to, for example, the decoder circuit (see 1110 of FIG. 1A) of the peripheral circuit structure PS. Substrate insulating patterns 25 may be disposed between the second substrate 201 and the edge through-vias ETHV. A second via insulating pattern SS2 may be disposed between the edge through-via ETHV and the planarization insulating layer 220, between the edge through-via ETHV and the substrate insulating pattern 25, between the edge through-via ETHV and the intermediate insulating layer 21, and between the edge through-via ETHV and the etch stop layer 111. Each of the substrate insulating patterns 25 may be disposed in a substrate hole SH and may have a doughnut shape in a plan view.

Referring to FIGS. 4A, 4B and 5B, the edge through-via ETHV may have the same shape as the bit line through-via BLTHV. The second via insulating pattern SS2 may have the same shape as the first via insulating pattern SS1. The edge through-vias ETHV and the bit line through-vias BLTHV may include at least one metal selected from a group consisting of tungsten, aluminum, copper, titanium, and tantalum. The via insulating patterns SS1 and SS2 may include an insulating material such as silicon oxide, silicon nitride, and/or silicon oxynitride.

The edge through-via ETHV may include a first via portion TP1, a second via portion TP2 and a third via portion TP3, which are integrally formed with each other. In other words, the first to third via portions TP1, TP2 and TP3 may constitute one body. The first via portion TP1 may be disposed in a first through-hole TH1 formed in the first upper insulating layer 205, the planarization insulating layer 220 and the substrate insulating pattern 25. The second via portion TP2 and the third via portion TP3 may be disposed in a second through-hole TH2 formed in the intermediate insulating layer 21 and the etch stop layer 111. The second via insulating pattern SS2 may be disposed between the edge through-via ETHV and inner sidewalls of the first and second through-holes TH1 and TH2.

The third via portion TP3 may penetrate the second via insulating pattern SS2 so as to be in contact with the second peripheral conductive pad 30*b*. The second via insulating pattern SS2 may be in contact with a sidewall of the first via portion TP1, a top surface, a sidewall and a bottom surface of the second via portion TP2, and a sidewall of the third via portion TP3. A portion of the second via insulating pattern SS2 may be disposed between the second via portion TP2 and the substrate insulating pattern 25 and between the second via portion TP2 and the second peripheral conductive pad 30*b*. The second via insulating pattern SS2 may have a first thickness T1 which is substantially constant regardless of its position. In the present embodiments, a height H1 of the second through-hole TH2 may be greater than twice the first thickness T1. The second via insulating pattern SS2 may not completely fill the second through-hole TH2. A top surface of the second via insulating pattern SS2 covering the top surface of the second via portion TP2 may be coplanar with a top surface of the intermediate insulating layer 21.

Each of the first and second peripheral conductive pads 30*a* and 30*b* may have a first width W1 in the first direction D1. The second through-hole TH2 may have a second width W2 in the first direction D1, which is greater than the first width W1. The first via portion TP1 may have a third width W3 in the first direction D1. The second via portion TP2 may have a fourth width W4 in the first direction D1, which is greater than the third width W3. The third via portion TP3 may have a fifth width W5 in the first direction D1, which is less than the fourth width W4. The substrate insulating pattern 25 may have a sixth width W6 in the first direction D1. The sixth width W6 may be greater than the second width W2. The fourth width W4 may be less than the second width W2. The fifth width W5 may be equal to or less than the third width W3. The second via insulating pattern SS2 may be spaced apart from the second substrate 201. The first through-hole TH1 may have a ninth width W9 less than the second width W2.

Referring to FIGS. 2, 4B and 5B, a substrate contact plug 23 penetrating the intermediate insulating layer 21 and the etch stop layer 111 may be disposed under the second substrate 201 of the edge region EDR. The substrate contact plug 23 may include poly-silicon doped with dopants. The substrate contact plug 23 may be in contact with the third peripheral conductive pad 30*c*. The substrate contact plug 23 may prevent the second substrate 201 from being electrically floated. The substrate contact plug 23 may function as an electrical connection path or bypass for grounding the second substrate 201. The substrate contact plug 23 may have a seventh width W7 in the first direction D1. The third peripheral conductive pad 30*c* may have an eighth width W8 in the first direction D1, which is greater than the seventh width W7.

In the 3D semiconductor memory device according to the present embodiments, misalignment may be reduced or minimized due to the structures of the through-vias BLTHV and ETHV, and thus reliability may be improved. In addition, an insulating distance between adjacent through-vias BLTHV and ETHV may be secured by the via insulating patterns SS1 and SS2, and thus a parasitic capacitance may be reduced to minimize/prevent operation errors.

FIGS. 6A to 6E are cross-sectional views illustrating a process of manufacturing a 3D semiconductor memory device of FIG. 4B.

Referring to FIGS. 2, 4A, 5B and 6A, a peripheral circuit structure PS may be manufactured. A device isolation layer 105 may be formed in a first substrate 103 to define active regions. Peripheral transistors PTR may be formed on the active regions. A multi-layered peripheral interlayer insulating layer 107 may be formed to cover the peripheral transistors PTR, and peripheral contacts 33 and peripheral wiring lines 109 may be formed in the peripheral interlayer insulating layer 107. First to third peripheral conductive pads 30*a*, 30*b* and 30*c* may be formed in a top end portion of the peripheral circuit structure PS. An etch stop layer 111 and an intermediate insulating layer 21 may be sequentially formed on an entire top surface of the peripheral circuit structure PS. The intermediate insulating layer 21 and the etch stop layer 111 may be patterned to form lower holes BH exposing the first to third peripheral conductive pads 30*a* to 30*c*, respectively. A poly-silicon layer doped with dopants may be formed to fill the lower holes BH, and then, a chemical mechanical polishing (CMP) process may be performed on the poly-silicon layer to form sacrificial patterns 40 and a substrate contact plug 23 in the lower holes BH. Each of the sacrificial patterns 40 may have the second width W2, like the second through-hole TH2. The substrate contact plug 23 may have the width W7 less than the width W8 of the third peripheral conductive pad 30*c* like FIG. 5B, and thus a misalignment margin may be secured in the formation of the substrate contact plug 23.

Subsequently, a second substrate 201 may be formed on the intermediate insulating layer 21. The second substrate 201 may be formed by forming a semiconductor epitaxial layer or attaching a single-crystalline semiconductor substrate onto the intermediate insulating layer 21. The second substrate 201 may be referred to as a semiconductor layer. The second substrate 201 may be patterned to form a plurality of substrate holes SH, and substrate insulating patterns 25 may be formed by filling the substrate holes SH with an insulating material. The substrate insulating patterns 25 may be formed to have a width W6 greater than the width W2 of the sacrificial pattern 40. The second substrate 201 may be spaced apart from the sacrificial patterns 40 by the substrate insulating patterns 25.

Figure 6A:
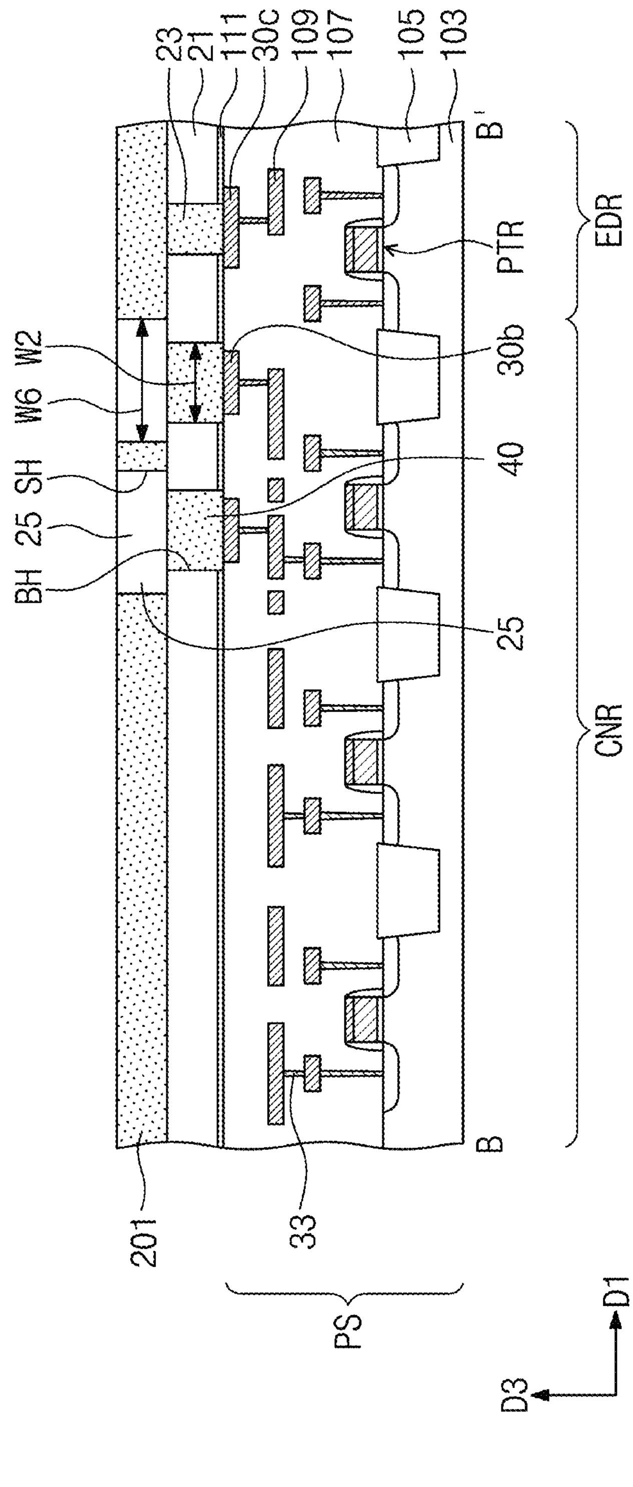
FIGS. 6A to 6E are cross-sectional views illustrating a process of manufacturing a 3D semiconductor memory device of FIG. 4B.
Figure 6B:
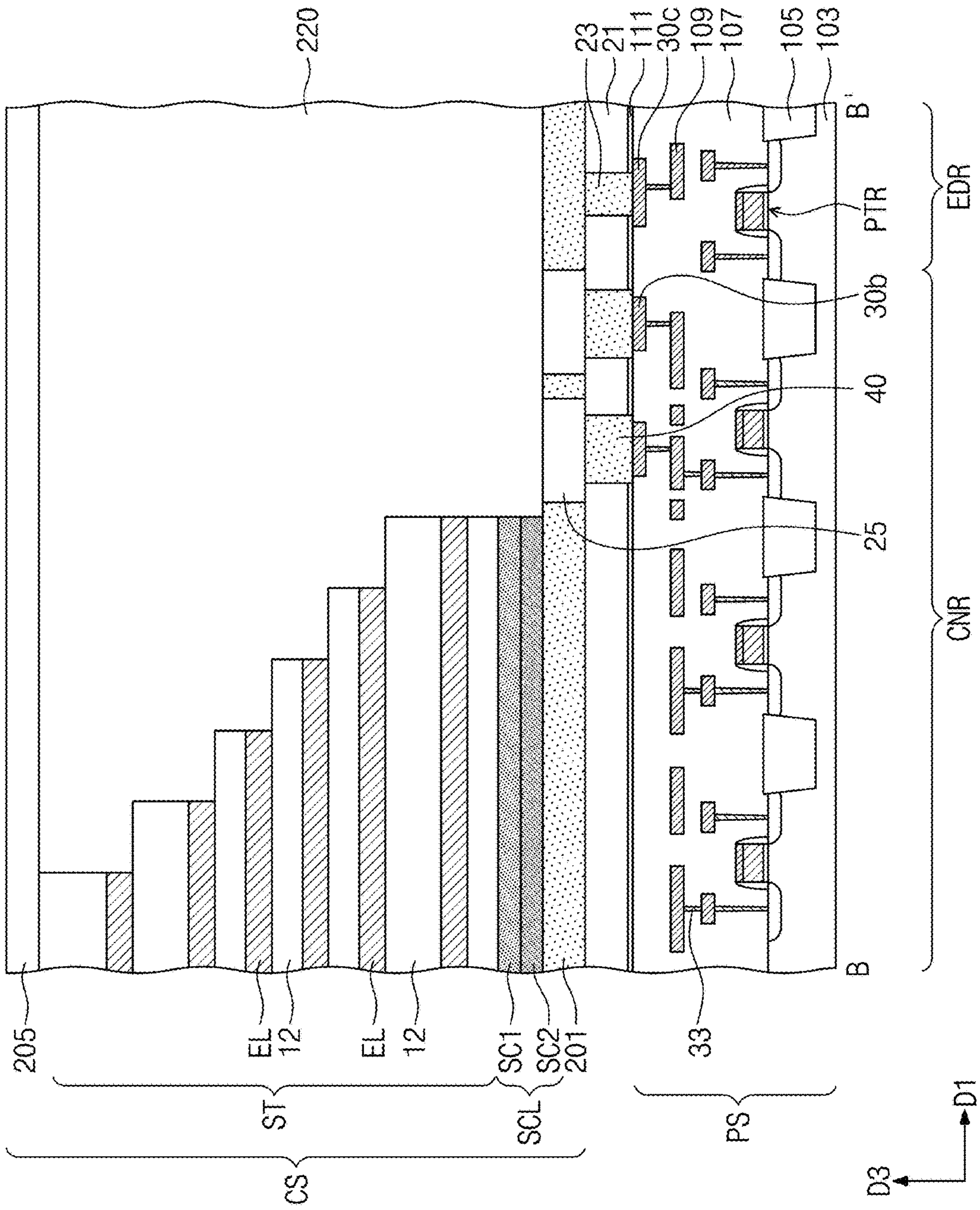

Referring to FIGS. 2, 4A and 6B, a source structure SCL, a stack structure ST, a planarization insulating layer 220, vertical semiconductor patterns VS, vertical patterns CDVS and EDVS and a first upper insulating layer 205 may be formed on the second substrate 201 through various processes.

Figure 6C:
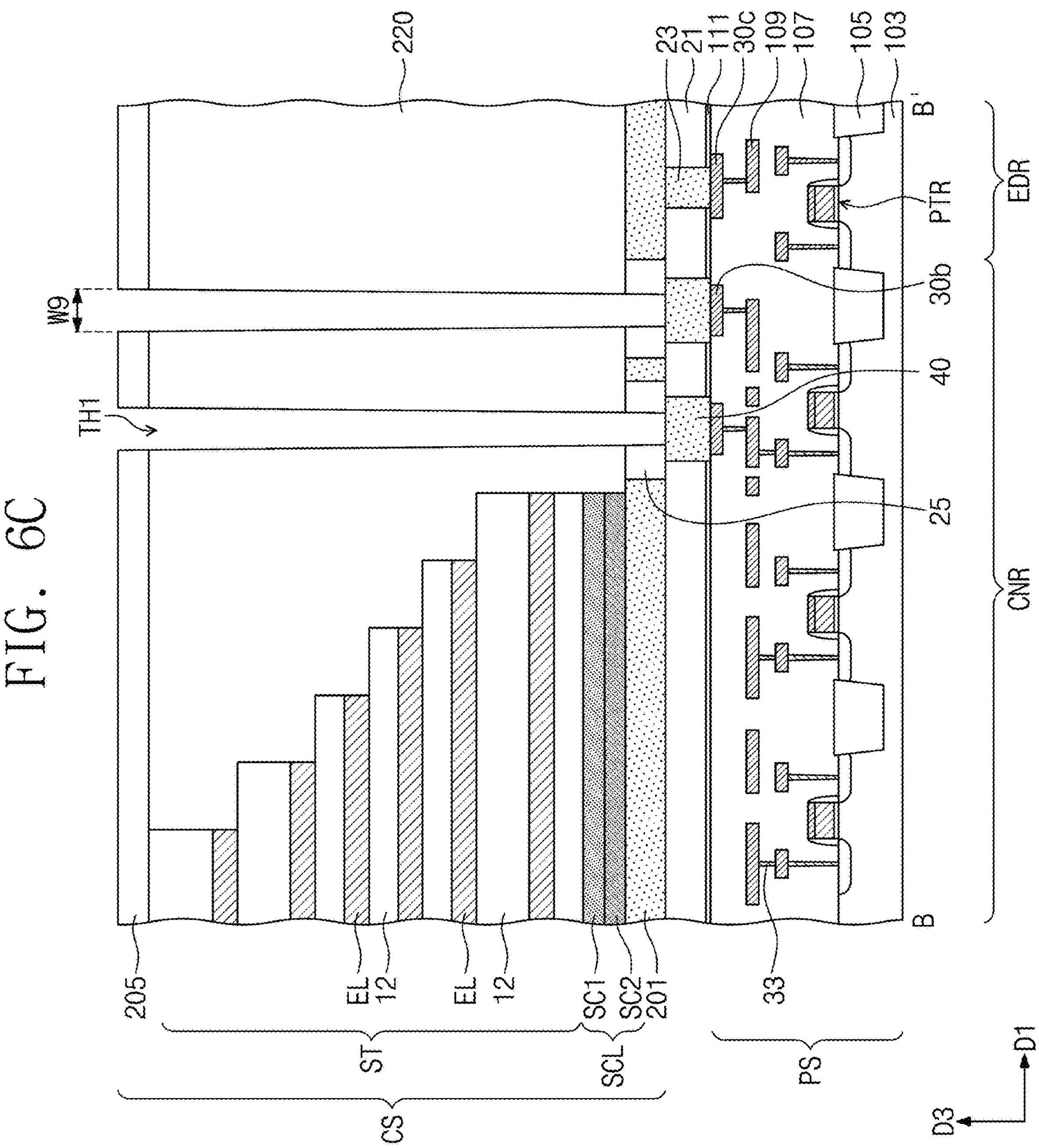

Referring to FIGS. 2, 4A and 6C, in the connection region CNR, a first through-hole TH1 exposing the sacrificial pattern 40 may be formed by sequentially etching the first upper insulating layer 205, the planarization insulating layer 220 and the substrate insulating pattern 25. The first through-hole TH1 may be formed to have a ninth width W9. The ninth width W9 may be less than the width W2 of the sacrificial pattern 40.

Figure 6D:
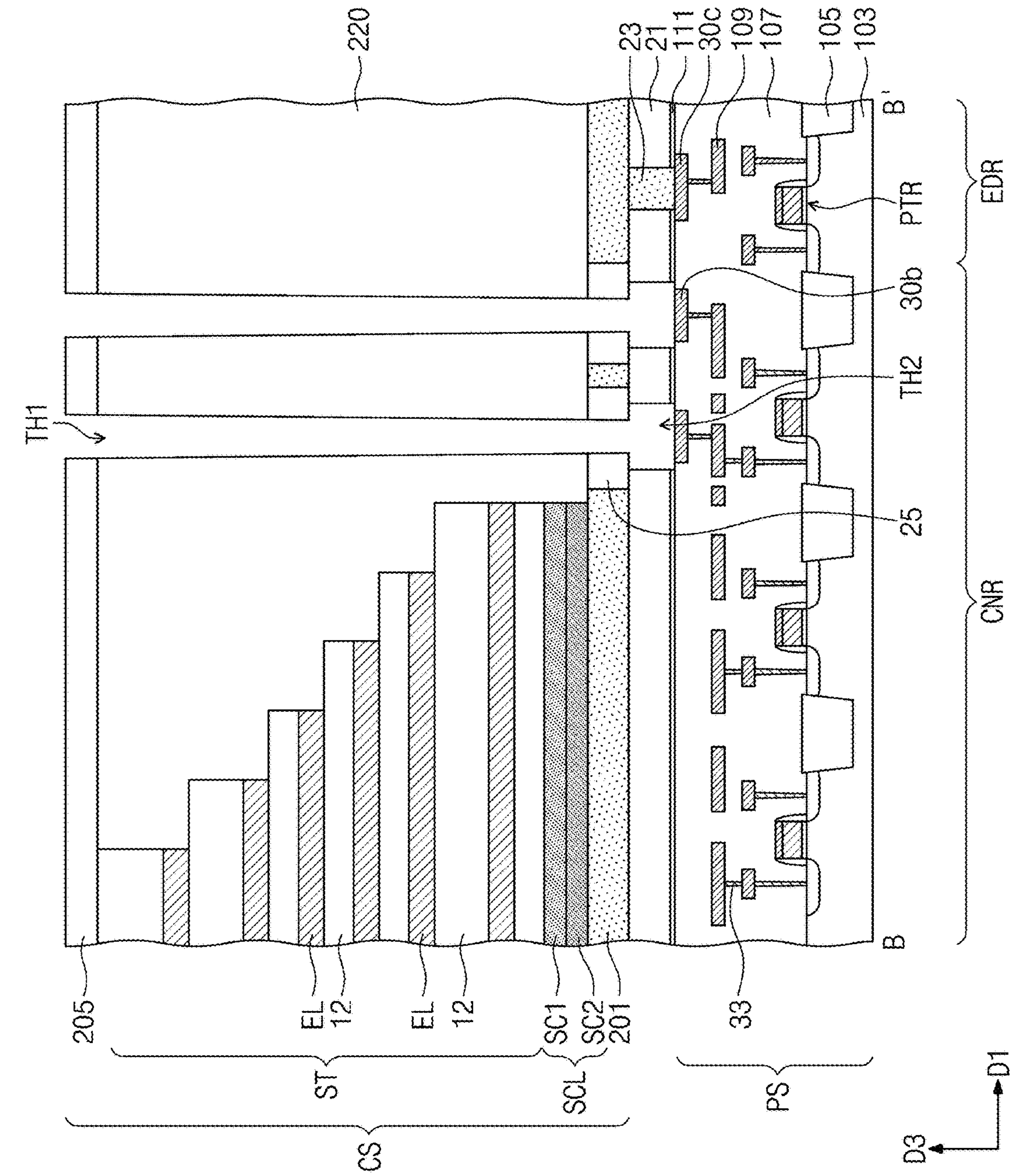

Referring to FIG. 6D, the sacrificial patterns 40 may be removed through the first through-holes TH1 by performing an isotropic etching process, thereby forming second through-holes TH2. Thus, the second through-hole TH2 may be formed to have the second width W2 of FIG. 5B. Since the second substrate 201 is spaced apart from the sacrificial patterns 40 by the substrate insulating patterns 25 in FIG. 6C, the second substrate 201 may not be damaged when removing the sacrificial patterns 40.

Figure 6E:
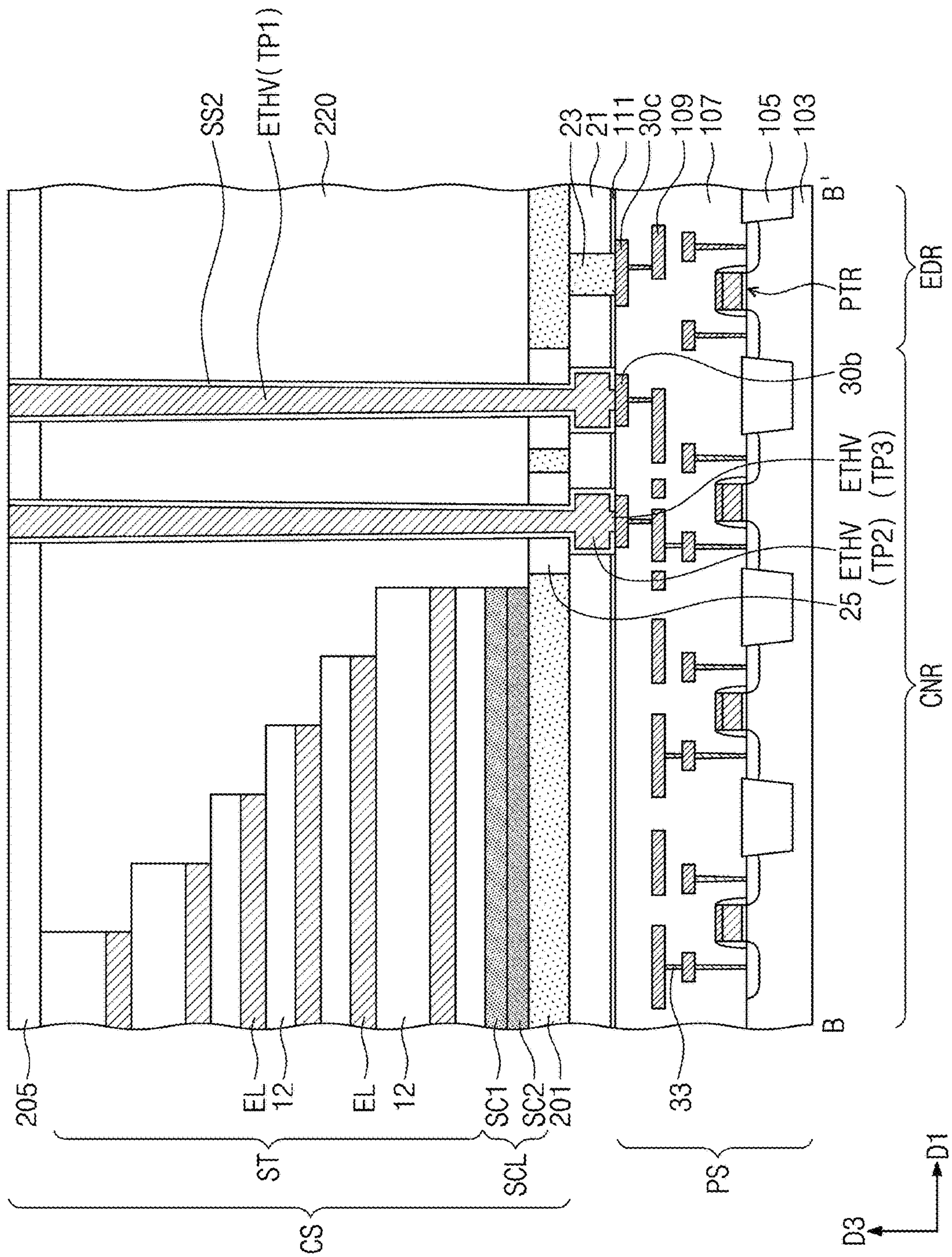

Referring to FIG. 6E, a via insulating layer may be conformally formed on the first upper insulating layer 205, and an anisotropic etching process may be performed on the via insulating layer to form a second via insulating pattern SS2 which covers inner sidewalls of the first and second through-holes TH1 and TH2 and exposes a top surface of the second peripheral conductive pad 30*b*. Subsequently, a conductive layer may be formed, and a CMP process may be performed on the conductive layer to form an edge through-via ETHV filling the first through-hole TH1 and the second through-hole TH2.

Subsequently, referring to FIGS. 4A and 4B, a second upper insulating layer 207 may be formed on the first upper insulating layer 205. Next, first to third contacts CT1 to CT3, cell contact plugs CC, first conductive lines BLL and second conductive lines CL may be formed.

In some embodiments, the bit line through-via BLTHV and the first via insulating pattern SS1 may be formed by the same and/or similar methods as the edge through-via ETHV and the second via insulating pattern SS2, respectively. For example, like FIG. 6A, a sacrificial pattern 40 may be formed on the first peripheral conductive pad 30*a* in the central through-via region THVR of the second dummy block BLKd2. When or after forming the first through-hole TH1 of FIG. 6C, a first through-hole TH1 for the bit line through-via BLTHV may be formed in the central through-via region THVR of the second dummy block BLKd2. When removing the sacrificial pattern 40 of the connection region CNR like FIG. 6D, the sacrificial pattern 40 of the central through-via region THVR may also be removed to form a second through-hole TH2 exposing the first peripheral conductive pad 30*a*. When forming the edge through-via ETHV and the second via insulating pattern SS2 in FIG. 6E, the bit line through-via BLTHV and the first via insulating pattern SS1 may be formed at the same time.

In the method of manufacturing the 3D semiconductor memory device according to the present embodiments, the widths W2 of the sacrificial patterns 40 may be greater than the widths W1 of the first and second peripheral conductive pads 30*a* and 30*b*, and thus the sacrificial pattern 40 may be easily exposed by the first through-hole TH1 even though misalignment occurs when forming the first through-hole TH1. In other words, a misalignment margin may be secured using the sacrificial pattern 40. Thus, process defects may be reduced or prevented as compared with a case in which through-holes directly exposing the first and second peripheral conductive pads 30*a* and 30*b* are formed without the sacrificial pattern 40. As a result, a yield and reliability of the 3D semiconductor memory device may be improved.

In addition, in the method of manufacturing the 3D semiconductor memory device according to the present embodiments, the sacrificial pattern 40 may be formed when forming the substrate contact plug 23, and thus an additional process for forming the sacrificial pattern 40 may not be required. As a result, manufacturing processes may be simplified.

Figure 7A:
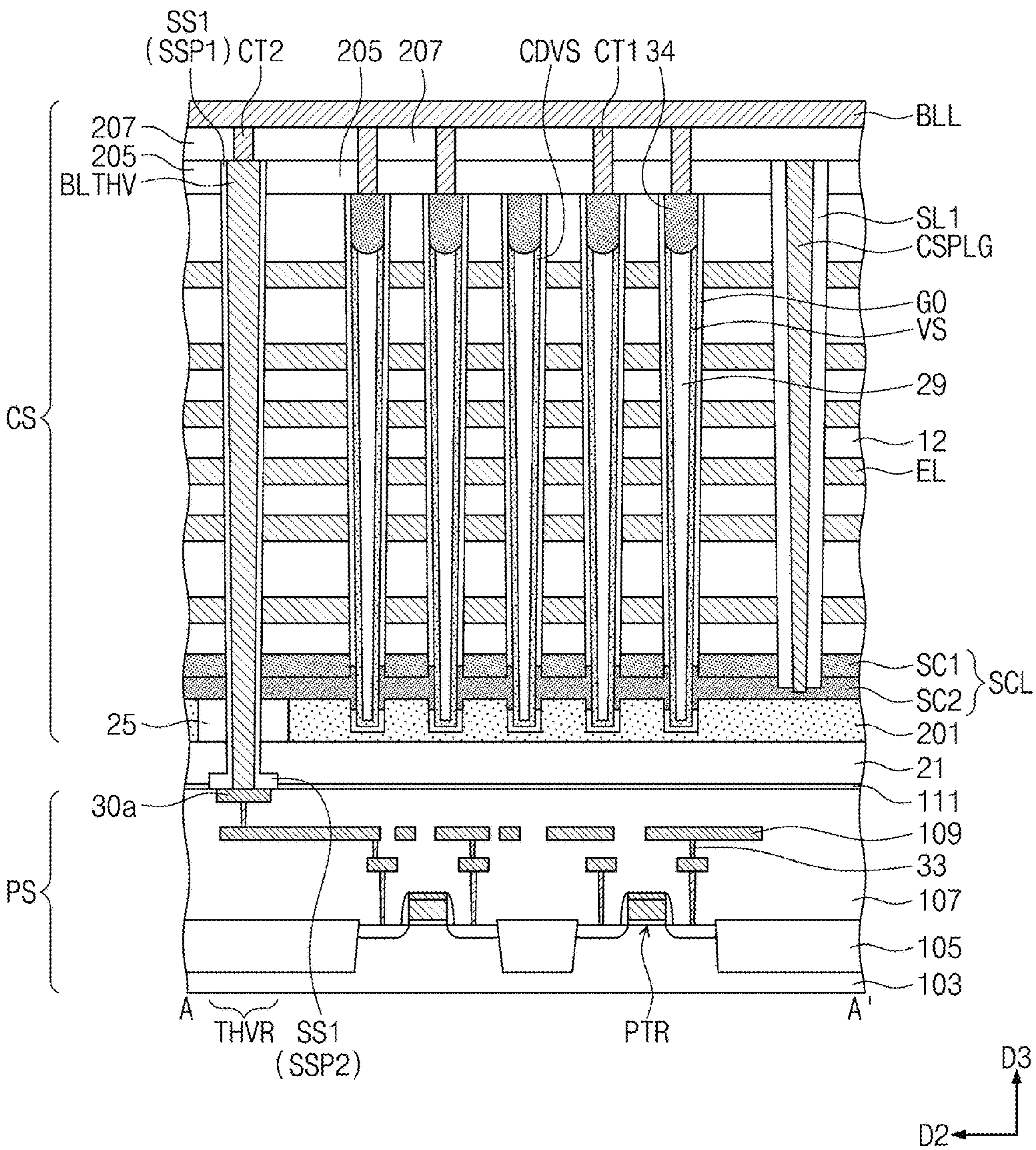
FIG. 7A is a cross-sectional view taken along the line A-A' of FIG. 3A according to some embodiments of inventive concepts.
Figure 7B:
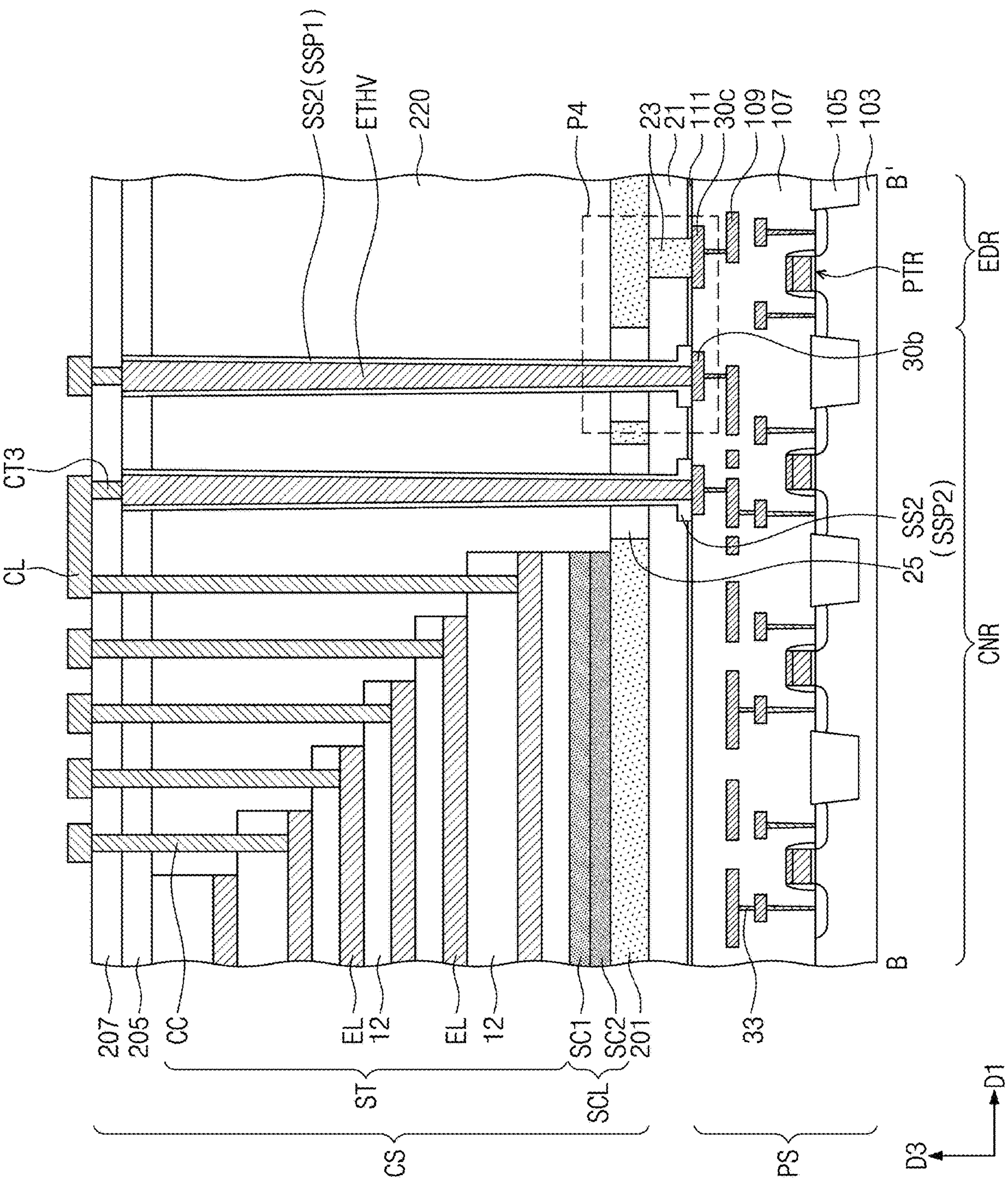
FIG. 7B is a cross-sectional view taken along the line B-B' of FIG. 3B according to some embodiments of inventive concepts.
Figure 7C:
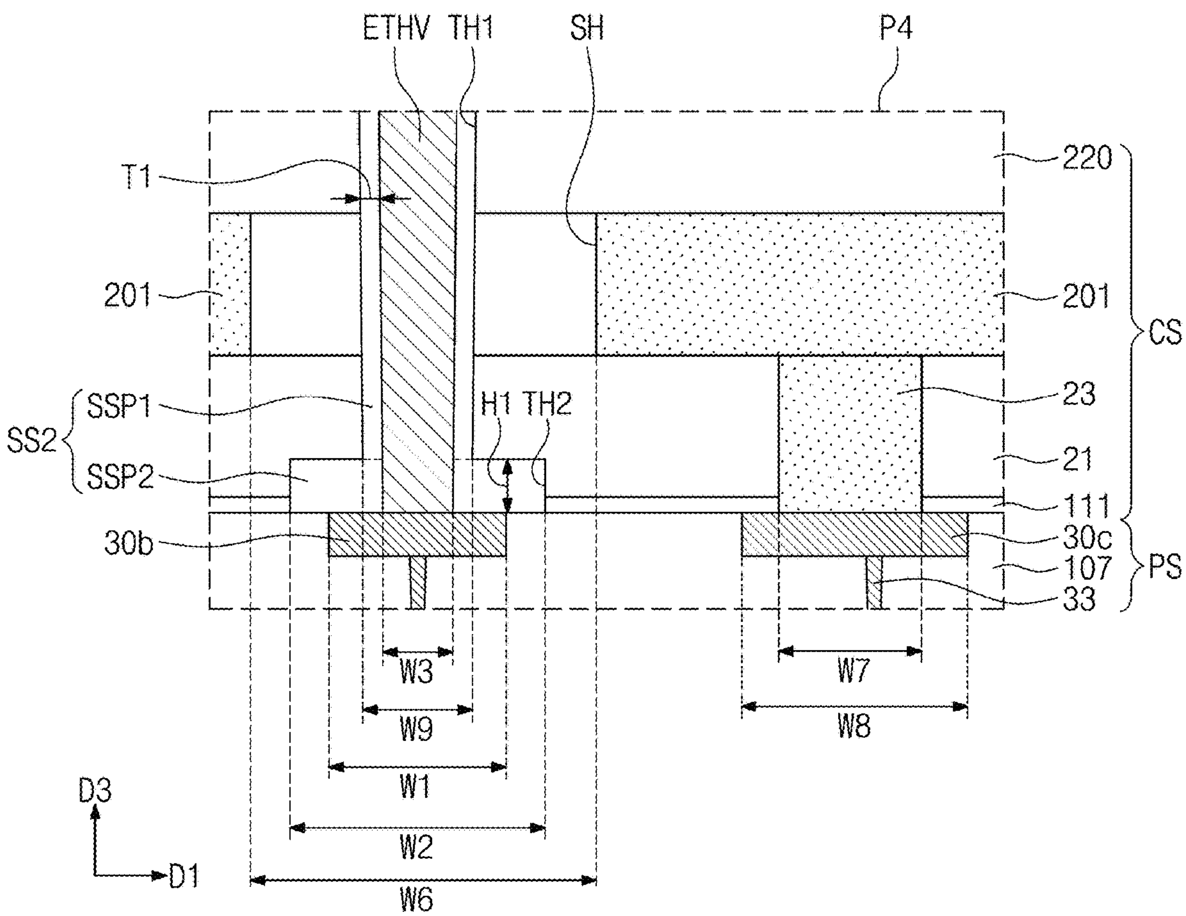
FIG. 7C is an enlarged view of a portion 'P4' of FIG. 7B.

FIG. 7A is a cross-sectional view taken along the line A-A' of FIG. 3A according to some embodiments of inventive concepts. FIG. 7B is a cross-sectional view taken along the line B-B' of FIG. 3B according to some embodiments of inventive concepts. FIG. 7C is an enlarged view of a portion 'P4' of FIG. 7B.

Referring to FIGS. 7A to 7C, in a 3D semiconductor memory device according to the present embodiments, a width W3 of each of a bit line through-via BLTHV and an edge through-via ETHV may reduce as they become closer to the peripheral circuit structure PS. The bit line through-via BLTHV and the edge through-via ETHV do not include the second via portion TP2 and the third via portion TP3 of FIG. 5B. Each of via insulating patterns SS1 and SS2 may include a first insulating portion SSP1 covering a sidewall of an upper portion of the through-via BLTHV or ETHV and disposed in a first through-hole TH1, and a second insulating portion SSP2 covering a sidewall of a lower portion of the through-via BLTHV or ETHV and disposed in a second through-hole TH2. The first insulating portion SSP1 and the second insulating portion SSP2 may be integrally formed with each other. The second insulating portion SSP2 may fill protruding sidewall portions of the second through-hole TH2. A height H1 of the second through-hole TH2 may range from 100% to 200% of a first thickness T1 of the first insulating portion SSP1 on the sidewall of the upper portion of the through-via BLTHV or ETHV. The height H1 of the second through-hole TH2 may correspond to a thickness of the second insulating portion SSP2. The second insulating portion SSP2 may laterally protrude from the first insulating portion SSP1 so as to be disposed between the intermediate insulating layer 21 and the peripheral circuit structure PS. A top surface of the second insulating portion SSP2 may be lower than a top surface of the intermediate insulating layer 21. The intermediate insulating layer 21 may cover the top surface and a sidewall of the second insulating portion SSP2. Other components may be the same as or similar to those described with reference to FIGS. 2 to 5B.

Figure 8A:
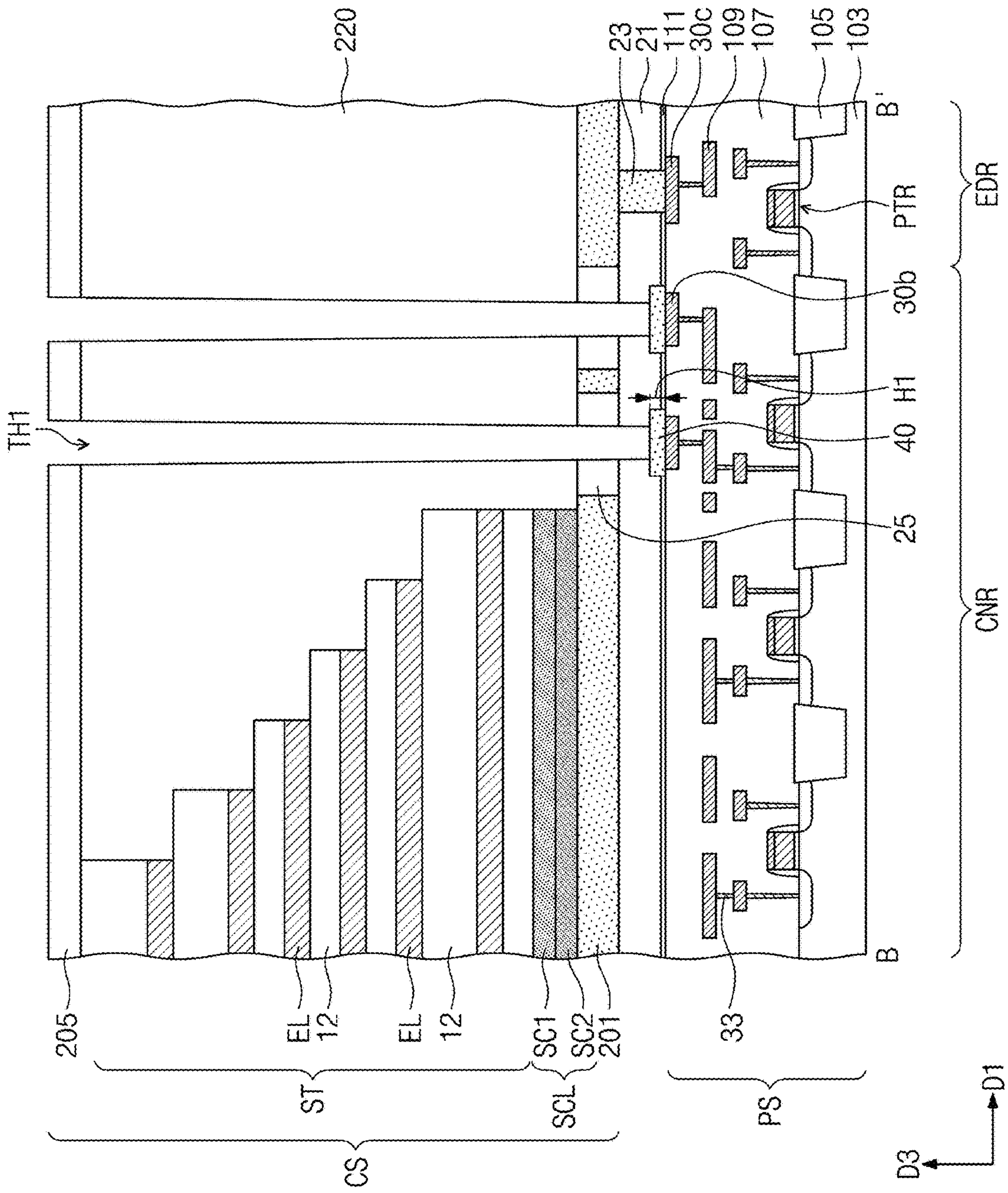
FIGS. 8A to 8C are cross-sectional views illustrating a process of manufacturing a 3D semiconductor memory device of FIG. 7B.
Figure 8B:
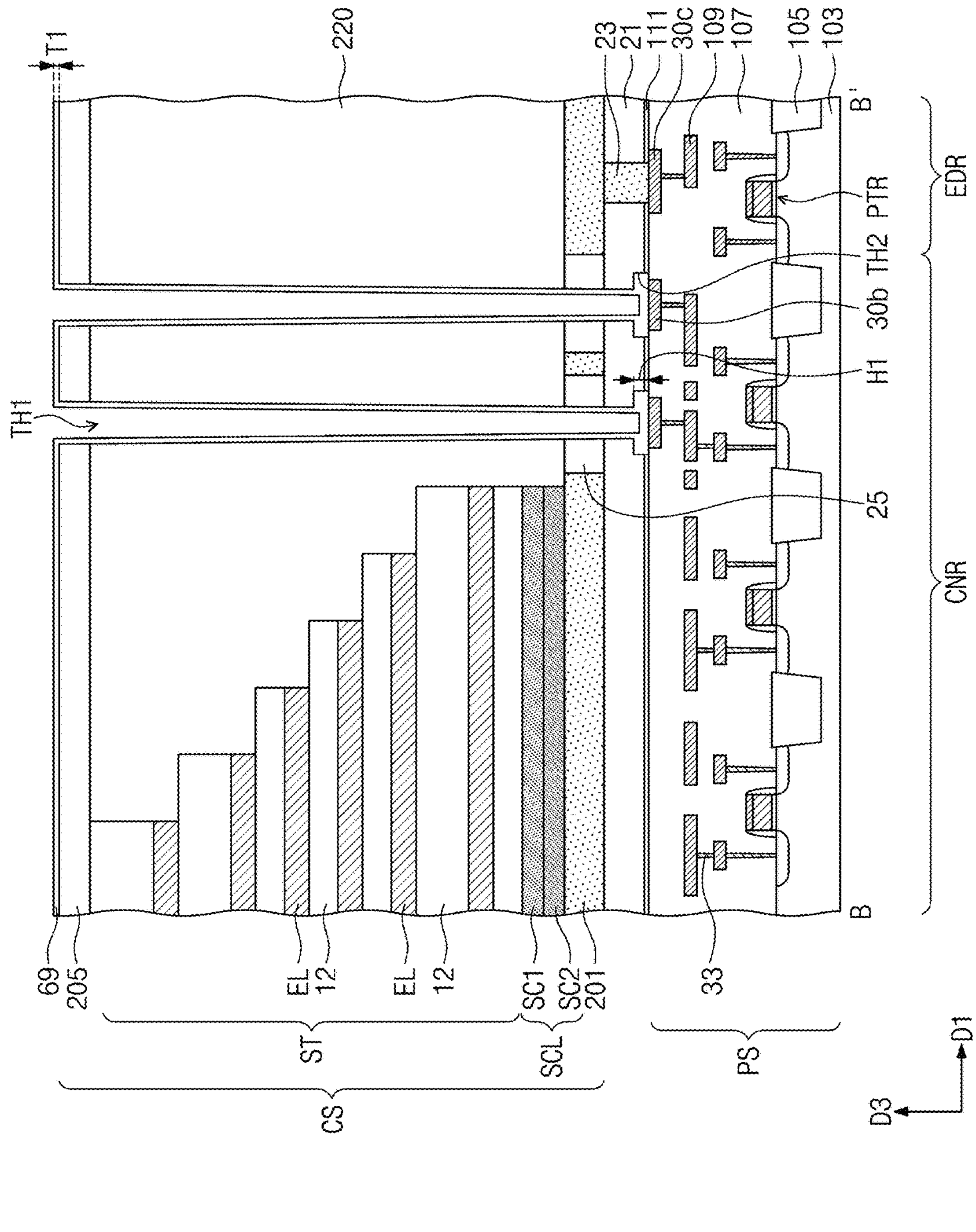
Figure 8C:
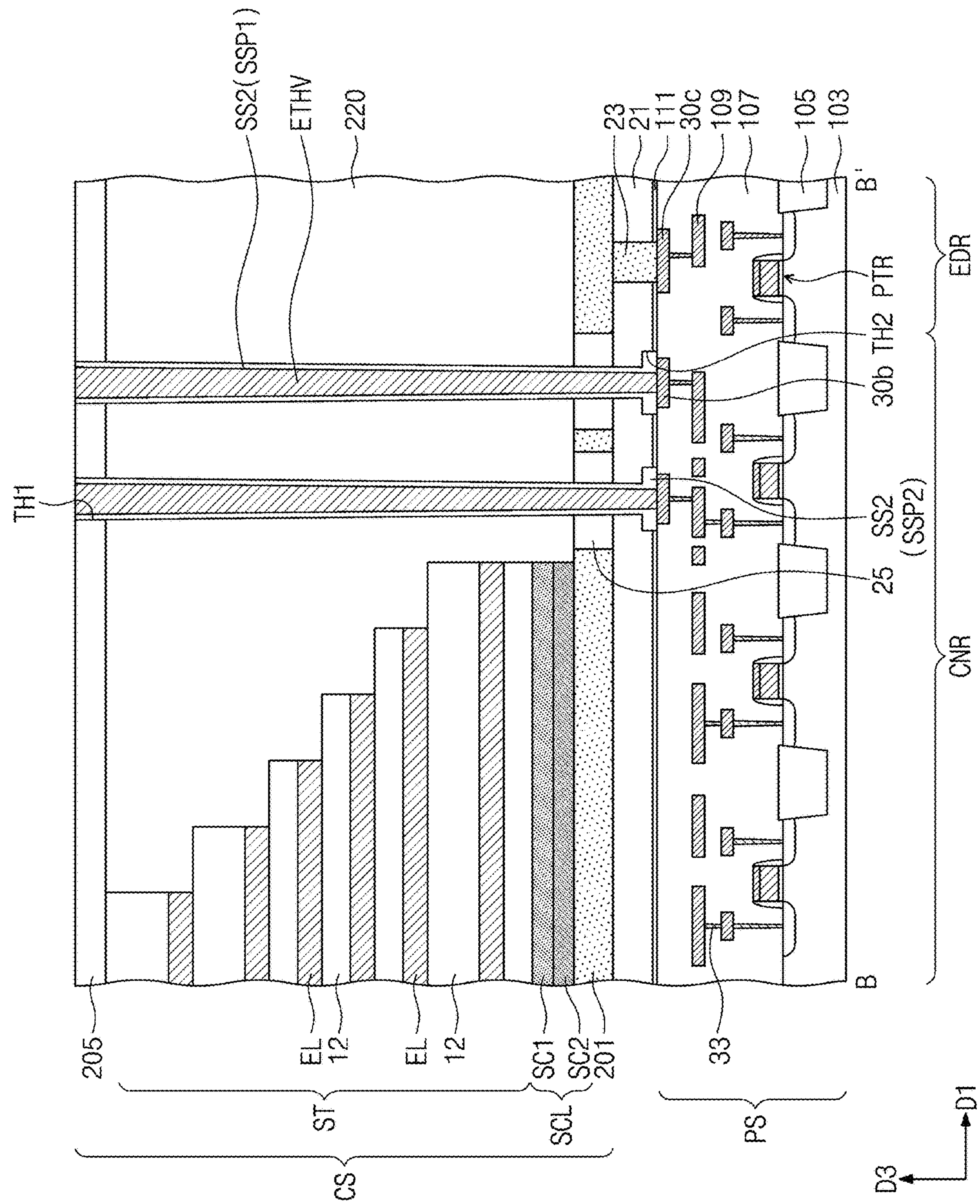

FIGS. 8A to 8C are cross-sectional views illustrating a process of manufacturing a 3D semiconductor memory device of FIG. 7B.

Referring to FIG. 8A, in the step of FIG. 6A, a sacrificial pattern 40 may be formed to be lower than a top surface of the substrate contact plug 23. In the present embodiments, the sacrificial pattern 40 may be formed to have a first height H1. Subsequently, the processes described with reference to FIGS. 6A to 6C may be performed, and a first through-hole TH1 exposing the sacrificial pattern 40 may be formed. In the present embodiments, the sacrificial pattern 40 may include a different material from that of the substrate contact plug 23.

Referring to FIG. 8B, the sacrificial pattern 40 may be removed through the first through-hole TH1 to form a second through-hole TH2. Next, a via insulating layer 69 may be conformally formed on the first upper insulating layer 205. The via insulating layer 69 may be formed to have a first thickness T1 which is substantially constant regardless of its position. The first thickness T1 may be a thickness which fills sidewall portions of the second through-hole TH2 but does not completely fill the first through-hole TH1. For example, the first thickness T1 may range from 50% to 100% of the first height H1.

Referring to FIGS. 7A and 8C, an anisotropic etching process may be performed on the via insulating layer 69, and thus the via insulating layer 69 on the first upper insulating layer 205 may be removed to expose the first upper insulating layer 205. In addition, the via insulating layer 69 on bottom surfaces of the second through-holes TH2 may be removed to expose top surfaces of the first and second peripheral conductive pads 30*a* and 30*b* and to form via insulating patterns SS1 and SS2. Subsequently, a conductive layer may be formed to fill the first and second through-holes TH1 and TH2, and a CMP process may be performed on the conductive layer to form through-vias BLTHV and ETHV. Other processes may be the same as or similar to those described with reference to FIGS. 6A to 6E.

Figure 9A:
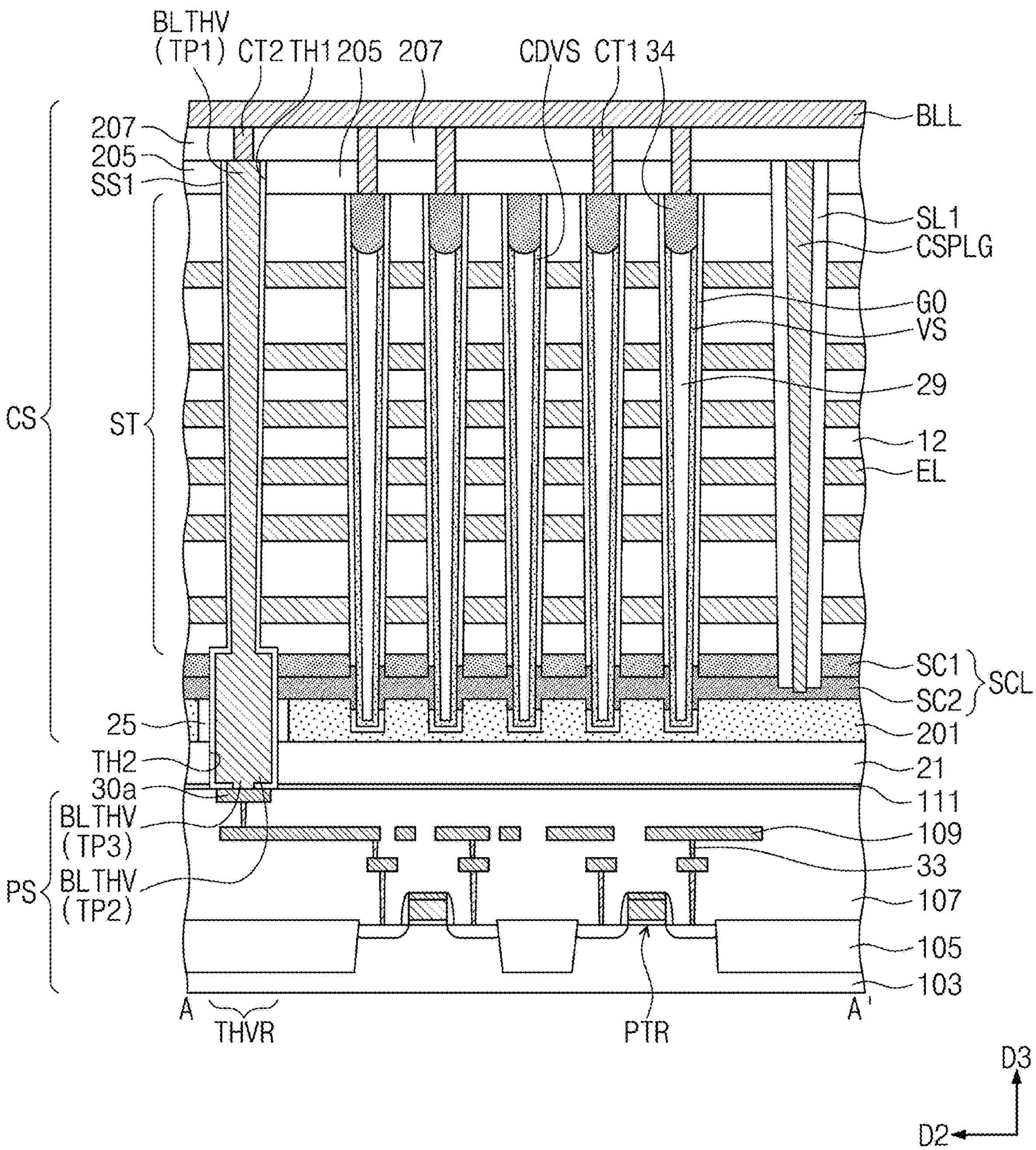
FIG. 9A is a cross-sectional view taken along the line A-A' of FIG. 3A according to some embodiments of inventive concepts.
Figure 9B:
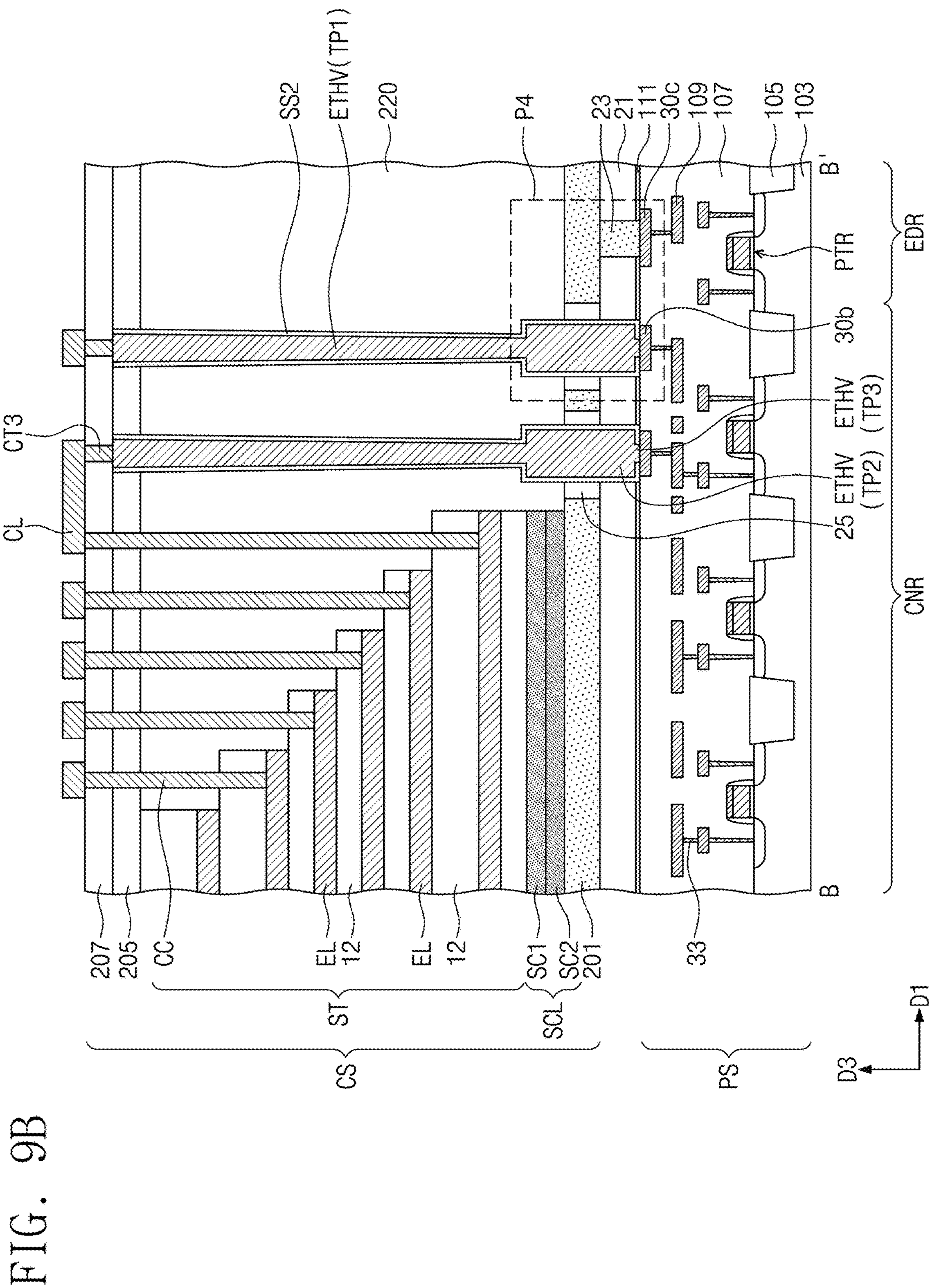
FIG. 9B is a cross-sectional view taken along the line B-B' of FIG. 3B according to some embodiments of inventive concepts.
Figure 9C:
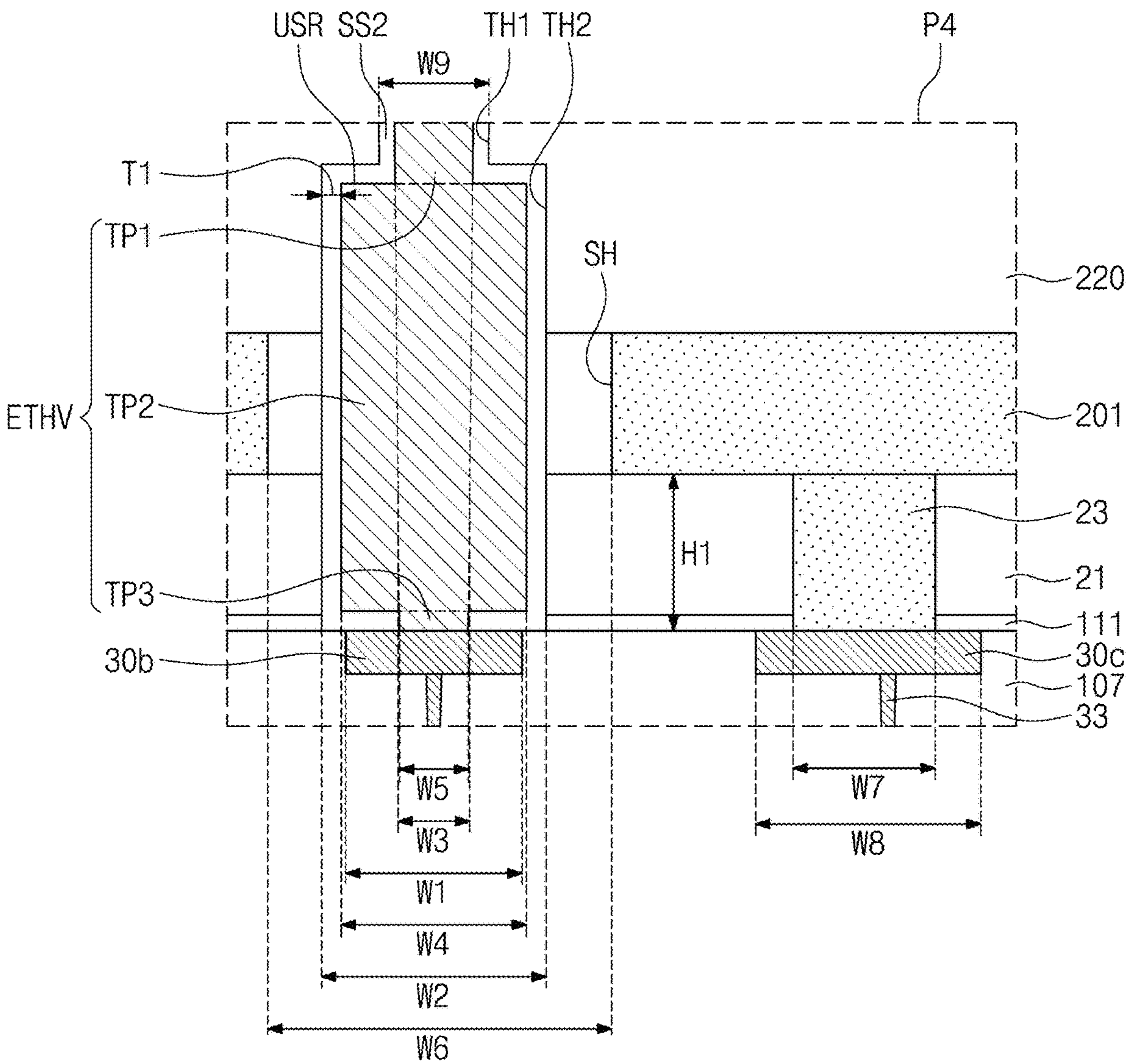
FIG. 9C is an enlarged view of a portion 'P4' of FIG. 9B.

FIG. 9A is a cross-sectional view taken along the line A-A' of FIG. 3A according to some embodiments of inventive concepts. FIG. 9B is a cross-sectional view taken along the line B-B' of FIG. 3B according to some embodiments of inventive concepts. FIG. 9C is an enlarged view of a portion 'P4' of FIG. 9B.

Referring to FIGS. 9A to 9C, in a 3D semiconductor memory device according to the present embodiments, each of through-vias BLTHV and ETHV may include a first via portion TP1, a second via portion TP2, and a third via portion TP3. The second via portion TP2 may penetrate the substrate insulating pattern 25 and may protrude from a top surface of the substrate insulating pattern 25. A top surface USR of the second via portion TP2 may be higher than a top surface of the second substrate 201. For example, the second via portion TP2 of the bit line through-via BLTHV may penetrate the source structure SCL and may extend into a lowermost electrode interlayer insulating layer 12. The first via insulating pattern SS1 may be disposed between the source structure SCL and the second via portion TP2 of the bit line through-via BLTHV in the central through-via region THVR. The second via portion TP2 of the edge through-via ETHV may extend into the planarization insulating layer 220 in the connection region CNR. Other components may be the same as or similar to those described with reference to FIGS. 4A, 4B and 5B.

Figure 10A:
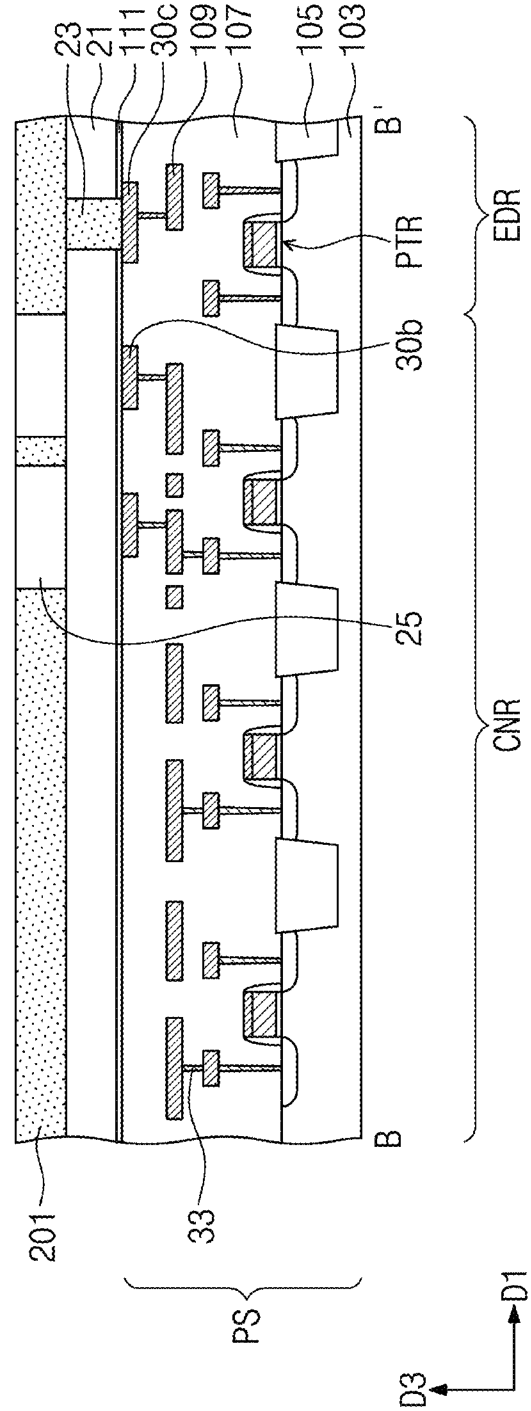
FIGS. 10A to 10C are cross-sectional views illustrating a process of manufacturing a 3D semiconductor memory device of FIG. 9B.
Figure 10B:
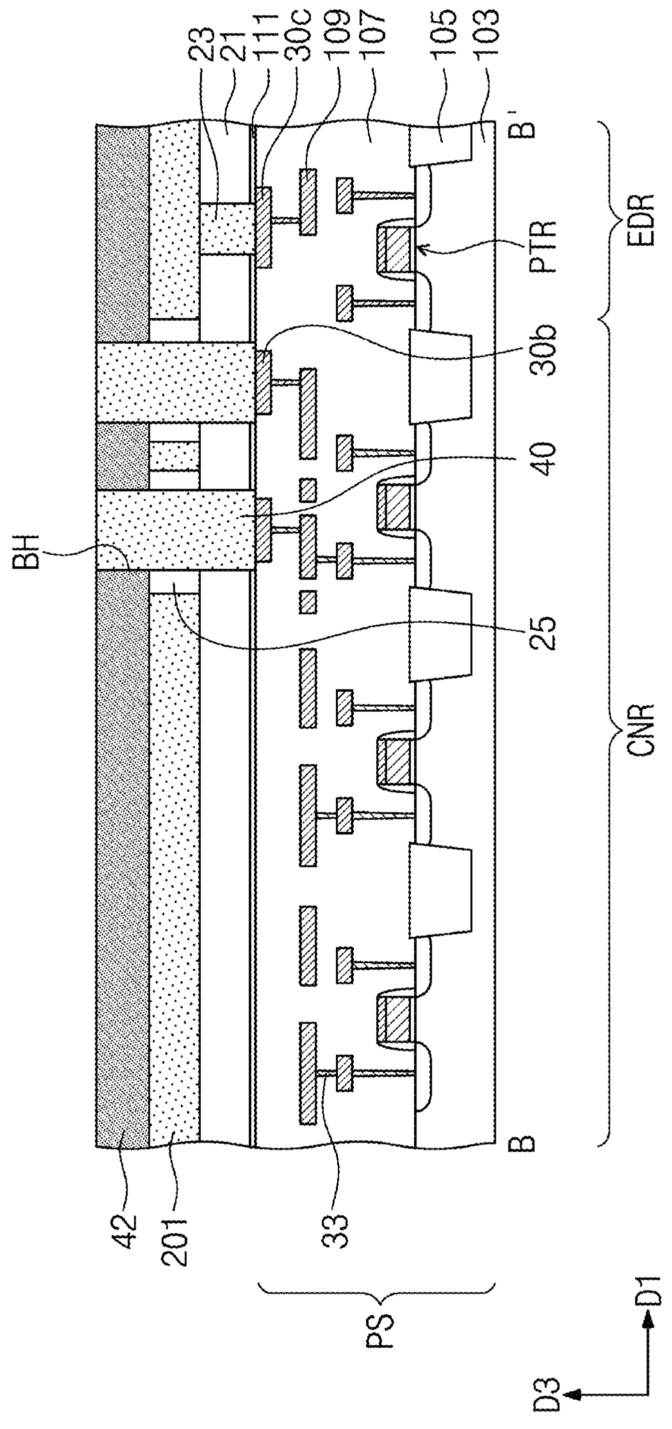
Figure 10C:
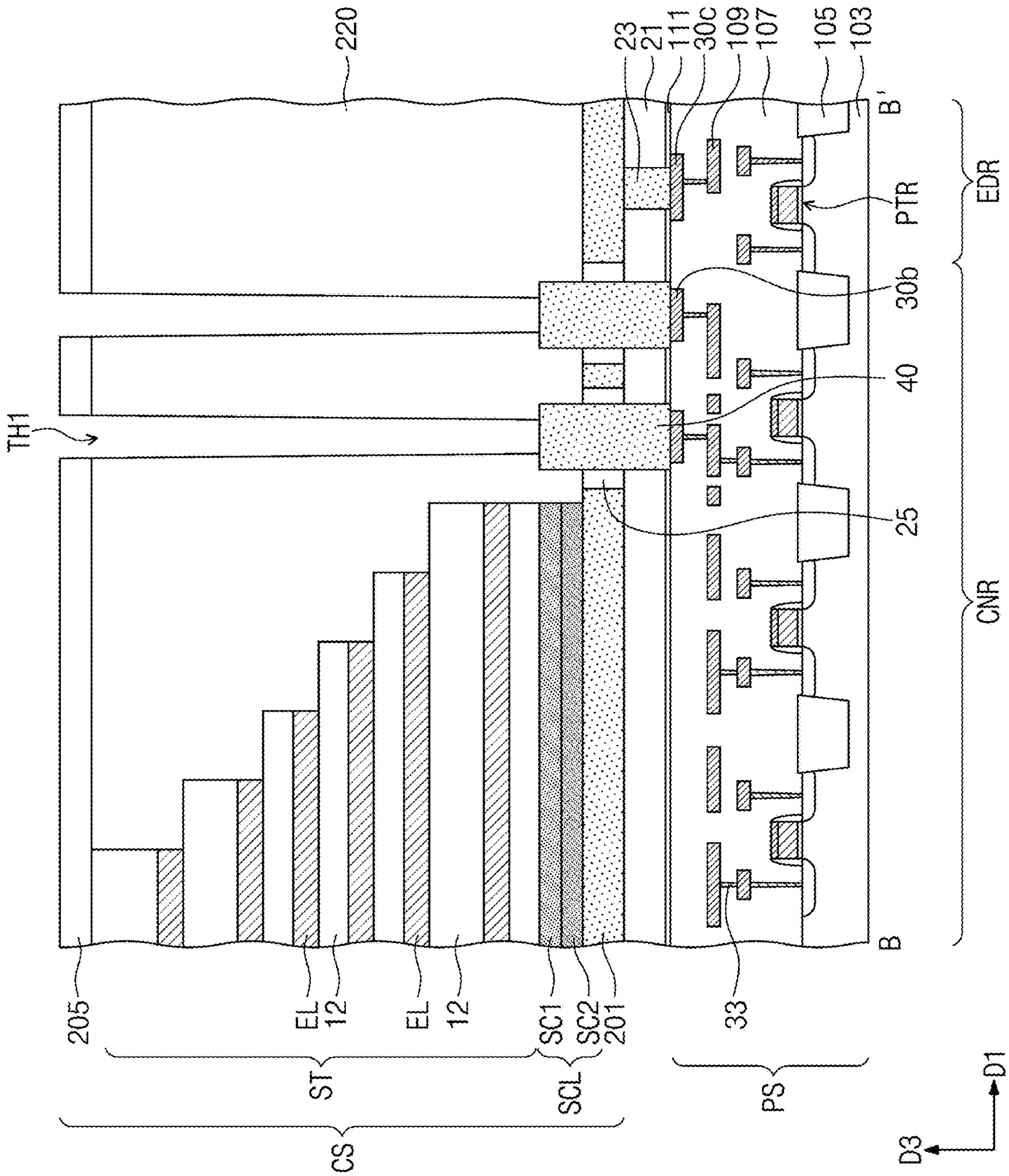

FIGS. 10A to 10C are cross-sectional views illustrating a process of manufacturing a 3D semiconductor memory device of FIG. 9B.

Referring to FIG. 10A, the formation of the sacrificial pattern 40 may be omitted in the step of FIG. 6A. Subsequently, the second substrate 201 and the substrate insulating patterns 25 may be formed on the intermediate insulating layer 21.

Referring to FIG. 10B, a lower sacrificial mold layer 42 may be formed on the second substrate 201. The lower sacrificial mold layer 42 may include a material having an etch selectivity with respect to both the second substrate 201 and the substrate insulating patterns 25. For example, the lower sacrificial mold layer 42 may include a silicon nitride layer. The lower sacrificial mold layer 42, the substrate insulating patterns 25, the intermediate insulating layer 21 and the etch stop layer 111 may be sequentially etched to form lower holes BH exposing the first and second peripheral conductive pads 30*a* and 30*b*. Sacrificial patterns 40 may be formed by filling the lower holes BH with a sacrificial material. Here, the sacrificial patterns 40 may include a material having an etch selectivity with respect to the substrate insulating patterns 25 and the lower sacrificial mold layer 42. For example, the sacrificial patterns 40 may include poly-silicon or silicon-germanium.

Referring to FIG. 10C, the lower sacrificial mold layer 42 may be removed to expose top surfaces and upper sidewalls of the sacrificial patterns 40. Next, the stack structure ST, the planarization insulating layer 220 and the first upper insulating layer 205 may be formed as described with reference to FIG. 6B. The first upper insulating layer 205 and the planarization insulating layer 220 may be etched to form first through-holes TH1 exposing the sacrificial patterns 40. At this time, since top surfaces of the sacrificial patterns 40 protrude from the top surface of the second substrate 201, the first through-holes TH1 may be easily formed to prevent a not-open defect. Subsequently, the processes described with reference to FIGS. 6D and 6E may be performed.

Figure 11:
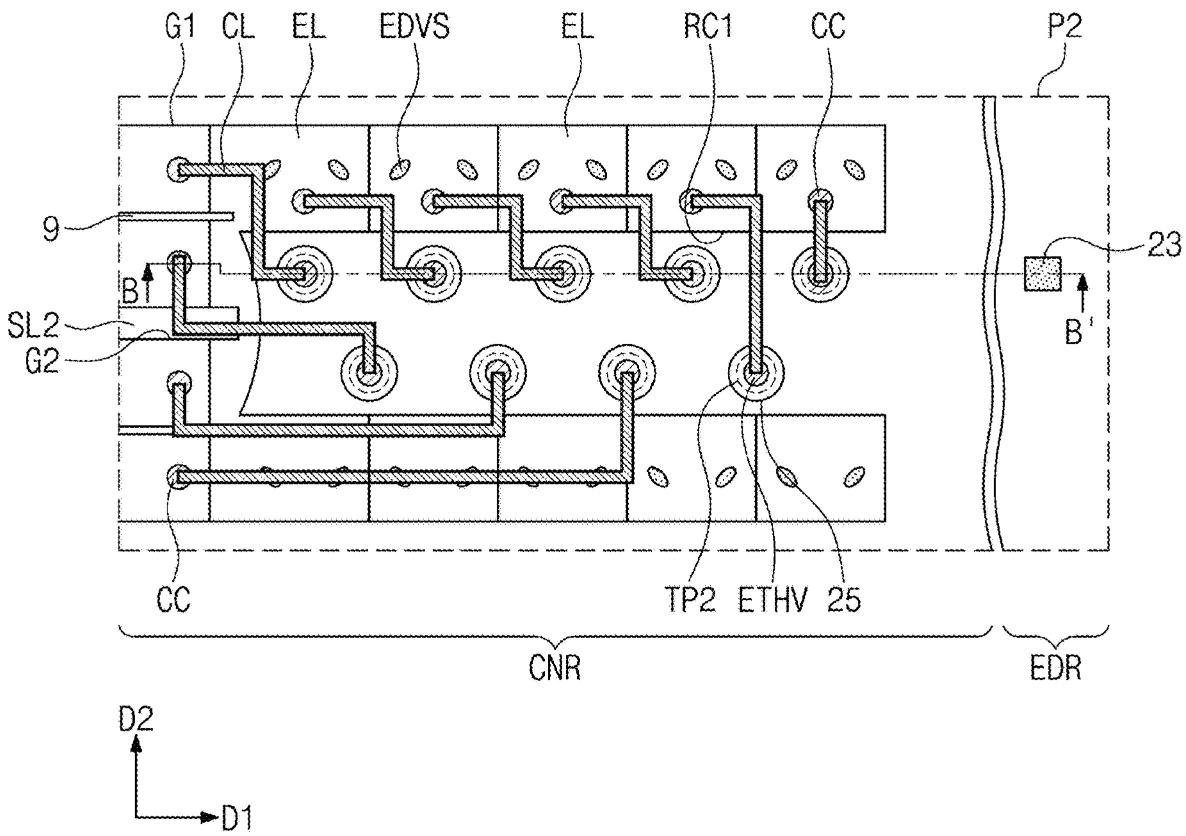
FIG. 11 is an enlarged plan view of the portion 'P2' of FIG. 2.
Figure 12:
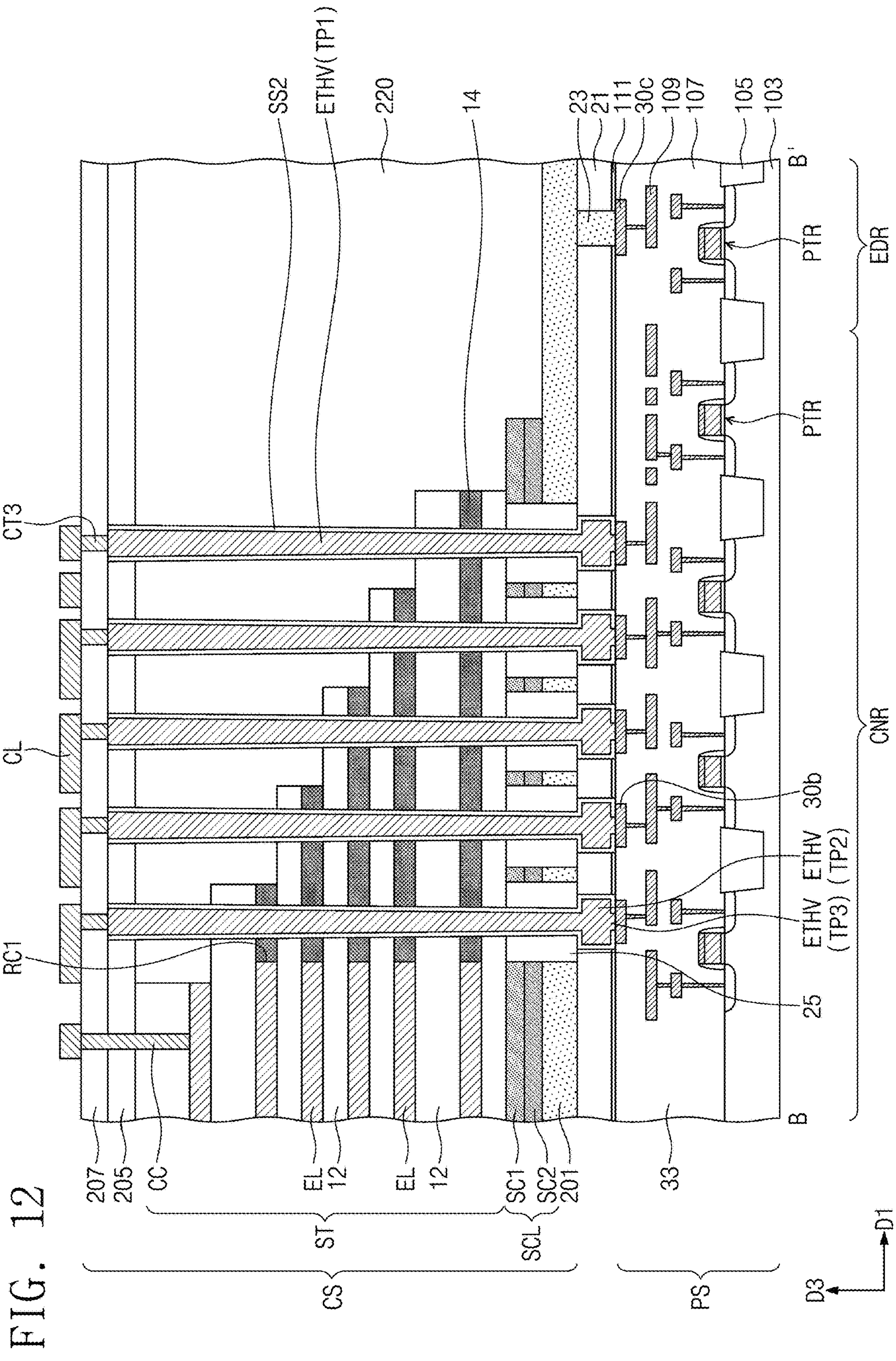
FIG. 12 is a cross-sectional view taken along a line B-B' of FIG. 11 according to some embodiments of inventive concepts.

FIG. 11 is an enlarged plan view of the portion 'P2' of FIG. 2. FIG. 12 is a cross-sectional view taken along a line B-B' of FIG. 11 according to some embodiments of inventive concepts.

Referring to FIGS. 11 and 12, in the connection region CNR, electrode layers EL of the stack structure ST may have regions RC1 laterally recessed in a direction opposite to the first direction D1, respectively. Each of the recessed regions RC1 may be filled with a mold sacrificial layer 14. The mold sacrificial layer 14 may include a material having an etch selectivity with respect to the electrode interlayer insulating layers 12. For example, the mold sacrificial layer 14 may include a silicon oxide layer. The mold sacrificial layer 14 may be in contact with top and bottom surfaces of the electrode interlayer insulating layers 12. Substrate insulating patterns 25 may penetrate the source structure SCL so as to be in contact with the lowermost electrode interlayer insulating layer 12. In the connection region CNR, edge through-vias ETHV may penetrate the electrode interlayer insulating layers 12, the mold sacrificial layers 14, the substrate insulating patterns 25, the intermediate insulating layer 21 and the etch stop layer 111 so as to be in contact with the second peripheral conductive pads 30*b*. The edge through-via ETHV may have the same/similar structure as described with reference to FIGS. 4B and 5B. Alternatively, the edge through-via ETHV may have the structure of FIG. 7B or 9B. As shown in FIG. 11, a second conductive line CL may connect an edge through-via ETHV to a cell contact plug CC. That is, an edge through-via ETHV may connect one of electrode layers EL to a second peripheral conductive pad 30*b* of a peripheral circuit structure PS by a third contact CT3, a second conductive line CL and a cell contact plug CC.

Figure 13:
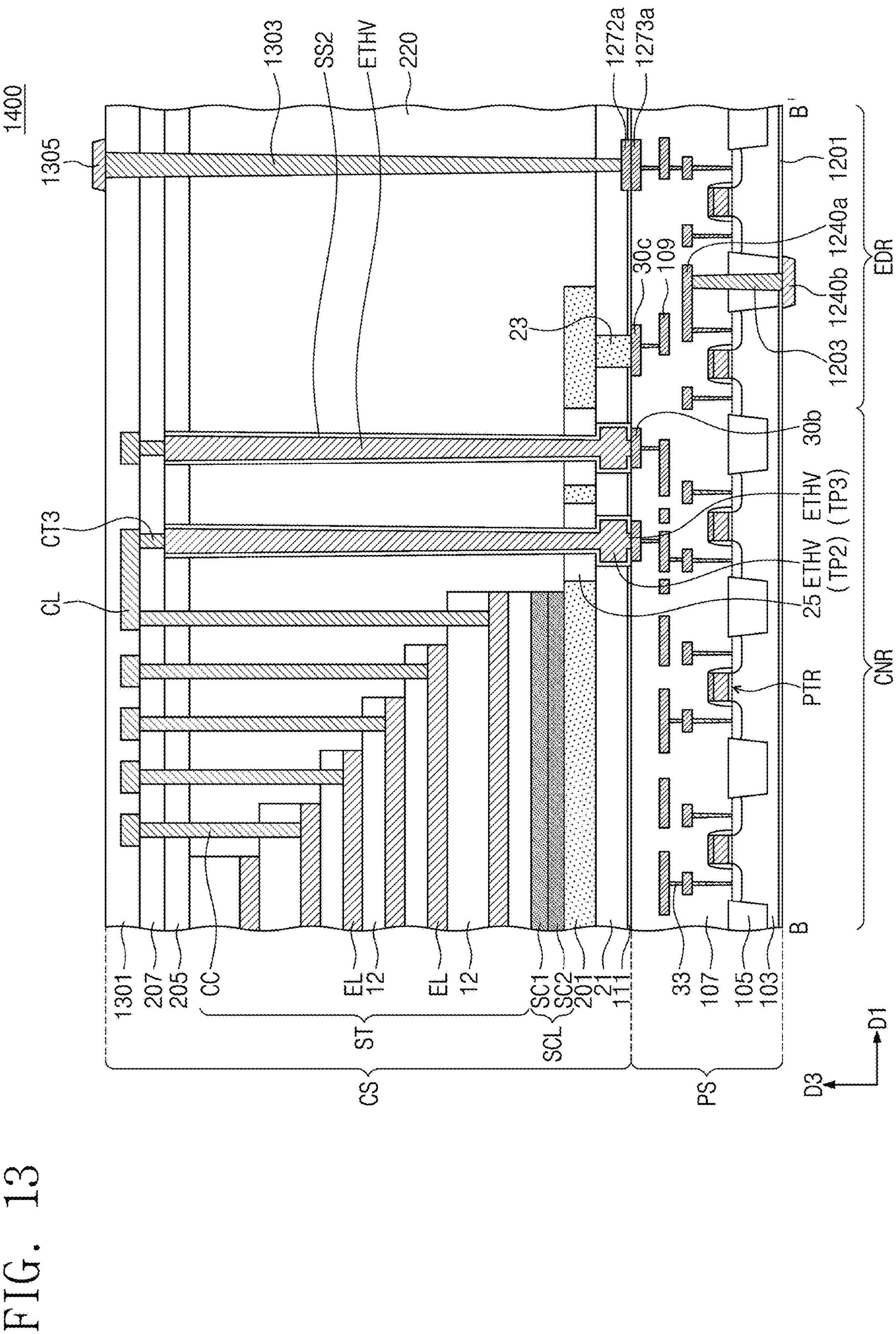
FIG. 13 is a cross-sectional view illustrating a semiconductor device according to some embodiments of inventive concepts.

FIG. 13 is a cross-sectional view illustrating a semiconductor device according to some embodiments of inventive concepts.

Referring to FIG. 13, a semiconductor device 1400 may have a chip-to-chip (C2C) structure. An upper chip including a cell array structure CS may be manufactured on a first wafer, a lower chip including a peripheral circuit structure PS may be manufactured on a second wafer different from the first wafer, and then, the upper chip and the lower chip may be connected to each other by a bonding method. The C2C structure may mean the upper and lower chips connected to each other by the bonding method. For example, the bonding method may mean a method of electrically connecting a first bonding metal 1272*a* formed in a lowermost metal layer of the upper chip to a second bonding metal 1273*a* formed in an uppermost metal layer of the lower chip. For example, when the first bonding metal 1272*a* and the second bonding metal 1273*a* are formed of copper (Cu), the bonding method may be a Cu-to-Cu bonding method. Alternatively, the first bonding metal 1272*a* and the second bonding metal 1273*a* may be formed of aluminum (Al) or tungsten (W).

Each of the peripheral circuit structure PS and the cell array structure CS of the semiconductor device 1400 may include a connection region CNR and an edge region EDR. The edge region EDR may be referred to as 'an external pad bonding region'.

The peripheral circuit structure PS may be the same as or similar to those described with reference to FIGS. 4A and 4B. The peripheral circuit structure PS may further include a peripheral internal connection wiring line 1240*a* and a first input/output contact plug 1203, which are disposed in the edge region EDR. A bottom surface of the first substrate 103 may be covered by a lower insulating layer 1201. A lower input/output pad 1240*b* may be disposed under the lower insulating layer 1201. The lower input/output pad 1240*b* may be connected to the peripheral internal connection wiring line 1240*a* through the first input/output contact plug 1203.

The cell array structure CS may be the same as or similar to those described with reference to FIGS. 4A and 4B. The cell array structure CS may further include a third upper insulating layer 1301 covering the second upper insulating layer 207. The cell array structure CS may further include a second input/output contact plug 1303 which penetrates the upper insulating layers 1301, 207 and 205, the planarization insulating layer 220 and the intermediate insulating layer 21 in the edge region EDR. An upper input/output pad 1305 may be disposed on the third upper insulating layer 1301.

In the 3D semiconductor memory device and the electronic system including the same according to the embodiments of inventive concepts, the misalignment margin may be secured by the structures of the through-vias, and thus the reliability may be improved. In addition, an insulating distance between adjacent through-vias may be secured by the via insulating patterns, and thus a parasitic capacitance may be reduced to minimize/prevent operation errors.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While inventive concepts have been described with reference to example embodiments, it will be apparent to those skilled in the art that various changes and modifications may be made without departing from the spirits and scopes of inventive concepts. Therefore, it should be understood that the above embodiments are not limiting, but illustrative. Thus, the scopes of inventive concepts are to be determined by the broadest permissible interpretation of the following claims and their equivalents, and shall not be restricted or limited by the foregoing description.

What is claimed is:

1. A three-dimensional (3D) semiconductor memory device comprising:

a peripheral circuit structure, an intermediate insulating layer and a cell array structure, which are sequentially stacked, the cell array structure including a first semiconductor substrate including a cell array region and a connection region, a stack structure including electrode layers and electrode interlayer insulating layers alternately stacked on the first semiconductor substrate, a planarization insulating layer covering an end portion of the stack structure on the connection region, a first through-via penetrating the planarization insulating layer, the first semiconductor substrate and the intermediate insulating layer, and the first through-via connecting one of the electrode layers to the peripheral circuit structure, the first through-via including a first via portion and a second via portion connected to each other, the first via portion penetrating the planarization insulating layer and having a first width, the second via portion penetrating the intermediate insulating layer and having a second width greater than the first width, and a flat area between the first via portion and the second via portion at a boundary between the first via portion and the second via portion.

2. The 3D semiconductor memory device of claim 1, wherein the peripheral circuit structure comprises a first conductive pad in contact with the first through-via, and the first conductive pad has a third width less than the second width.

3. The 3D semiconductor memory device of claim 2, wherein the first through-via further comprises a third via portion between the first conductive pad and the second via portion, the third via portion of the first through-via has a fourth width, the fourth width is less than the second width, and the first via portion, the second via portion, and the third via portion are connected to each other.

4. The 3D semiconductor memory device of claim 3, further comprising:

a substrate contact plug, wherein the peripheral circuit structure further comprises a second conductive pad located at a same height as the first conductive pad, the second conductive pad has a fifth width, the substrate contact plug is spaced apart from the first through-via and penetrates the intermediate insulating layer, the substrate contact plug connects the first semiconductor substrate to the second conductive pad, and the substrate contact plug has a sixth width less than the fifth width.

5. The 3D semiconductor memory device of claim 1, wherein the cell array structure further comprises a substrate insulating pattern, the substrate insulating pattern penetrates the first semiconductor substrate, the first via portion penetrates the substrate insulating pattern, and the substrate insulating pattern has a third width greater than the second width.

6. The 3D semiconductor memory device of claim 5, wherein the cell array structure further comprises a source structure between the first semiconductor substrate and the stack structure, wherein the substrate insulating pattern extends to penetrate the source structure, and wherein the first through-via penetrates the stack structure and the source structure.

7. The 3D semiconductor memory device of claim 1, wherein
the electrode layers have laterally recessed regions on the connection region, respectively,
the stack structure further comprises mold sacrificial layers,
the mold sacrificial layers fill the recessed regions and contact the electrode interlayer insulating layers on the connection region, respectively, and
the first through-via penetrates the mold sacrificial layers and the electrode interlayer insulating layers.

8. The 3D semiconductor memory device of claim 1, further comprising:
a via insulating pattern between the planarization insulating layer and the first through-via and between the intermediate insulating layer and the first through-via.

9. The 3D semiconductor memory device of claim 8, wherein a top surface of the via insulating pattern is closer to the peripheral circuit structure than a top surface of the intermediate insulating layer.

10. The 3D semiconductor memory device of claim 1, wherein the second via portion penetrates the first semiconductor substrate and extends into the planarization insulating layer.

11. The 3D semiconductor memory device of claim 1, wherein
the cell array structure further comprises vertical patterns, first conductive lines, and a second through-via,
the vertical patterns penetrate the stack structure so as to be adjacent to the first semiconductor substrate,
the first conductive lines are connected to the vertical patterns and cross over the stack structure,
the second through-via penetrates the stack structure, the first semiconductor substrate and the intermediate insulating layer on the cell array region,
the second through-via connects one of the first conductive lines to the peripheral circuit structure,
the second through-via comprises a third via portion and a fourth via portion integrally connected to each other,
the third via portion penetrates the stack structure and has a third width, and
the fourth via portion penetrates the intermediate insulating layer and has a fourth width greater than the third width.

12. The 3D semiconductor memory device of claim 1, wherein
a portion of the first semiconductor substrate in the cell array region is between a portion of the peripheral circuit structure and a lower surface of the stack structure.

13. An electronic system comprising:
a semiconductor device including a peripheral circuit structure, an intermediate insulating layer, and a cell array structure which are sequentially stacked, and the semiconductor device further including an input/output pad electrically connected to the peripheral circuit structure,
the cell array structure including a first substrate including a cell array region and a connection region, a stack structure comprising electrode layers and electrode interlayer insulating layers which are alternately stacked on the first substrate, a planarization insulating layer covering an end portion of the stack structure on the connection region, a substrate insulating pattern, and a first through-via,
the first through-via penetrating the planarization insulating layer, the substrate insulating pattern, the first substrate and the intermediate insulating layer,
the substrate insulating pattern being between the first substrate and the first through-via and the substrate insulating pattern being between than the planarization insulating layer and the intermediate insulating layer,
the first through-via connecting one of the electrode layers to the peripheral circuit structure,
the planarization insulating layer having a first through-hole having a first width,
the intermediate insulating layer having a second through-hole having a second width greater than the first width,
a flat area between the first through-hole and the second through-hole at a boundary between the first through-hole and the second through-hole, and
the first through-via is in the first through-hole and the second through-hole; and
a controller electrically connected to the semiconductor device through the input/output pad and configured to control the semiconductor device.

14. The electronic system of claim 13, wherein
the first through-via includes a first via portion and a second via portion connected to each other,
the first via portion penetrates the planarization insulating layer and has a third width, and
the second via portion penetrates the intermediate insulating layer and has a fourth width greater than the third width.

15. The electronic system of claim 14, wherein the second via portion penetrates the first substrate and extends into the planarization insulating layer.

16. The electronic system of claim 13, wherein
the peripheral circuit structure comprises a first conductive pad in contact with the first through-via, and
the first conductive pad has a third width less than the second width.

17. The electronic system of claim 13, wherein
the semiconductor device further comprises a via insulating pattern surrounding a sidewall of the first through-via,
the via insulating pattern comprises a first insulating portion in the first through-hole and a second insulating portion in the second through-hole,
the second insulating portion laterally protrudes from the first insulating portion, and
the second insulating portion is between an upper portion of the intermediate insulating layer and the peripheral circuit structure.

18. The electronic system of claim 13, wherein
the first substrate includes a semiconductor,
a portion of the first substrate in the cell array region is between a portion of the peripheral circuit structure and a lower surface of the stack structure.

* * * * *